(12) United States Patent
Hayashi et al.

(10) Patent No.: US 10,607,863 B2
(45) Date of Patent: Mar. 31, 2020

(54) SUBSTRATE PROCESSING APPARATUS

(71) Applicant: SHIBAURA MECHATRONICS CORPORATION, Yokohama-shi (JP)

(72) Inventors: Konosuke Hayashi, Yokohama (JP); Takashi Ootagaki, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 284 days.

(21) Appl. No.: 15/512,308

(22) PCT Filed: Sep. 30, 2015

(86) PCT No.: PCT/JP2015/077790
§ 371 (c)(1),
(2) Date: Mar. 17, 2017

(87) PCT Pub. No.: WO2016/052642
PCT Pub. Date: Apr. 7, 2016

(65) Prior Publication Data
US 2017/0278729 A1    Sep. 28, 2017

(30) Foreign Application Priority Data

Sep. 30, 2014   (JP) .................................. 2014-201917

(51) Int. Cl.
*H01L 21/67*    (2006.01)
*B08B 3/02*    (2006.01)
(Continued)

(52) U.S. Cl.
CPC .......... *H01L 21/67051* (2013.01); *B08B 3/02* (2013.01); *B08B 3/08* (2013.01); *B08B 3/10* (2013.01); *H01L 21/67034* (2013.01)

(58) Field of Classification Search
CPC ......... H01L 21/68785; H01L 21/68792; H01L 21/68728; H01L 21/67034;
(Continued)

(56) References Cited

U.S. PATENT DOCUMENTS

| 6,554,010 B1 | 4/2003 | Hirose et al. |
| 2007/0132976 A1* | 6/2007 | Nagasaka ............... G03B 27/00 355/57 |

(Continued)

FOREIGN PATENT DOCUMENTS

| JP | 2001-96238 A | 4/2001 |
| JP | 2005-217138 A | 8/2005 |

(Continued)

OTHER PUBLICATIONS

International Search Report dated Dec. 8, 2015 in PCT/JP2015/077790 filed Sep. 30, 2015.

(Continued)

*Primary Examiner* — Benjamin L Osterhout
(74) *Attorney, Agent, or Firm* — Oblon, McClelland, Maier & Neustadt, L.L.P.

(57) ABSTRACT

According to one embodiment, a substrate processing apparatus includes: a removing part (D1) configured to remove liquid droplets present in a recess (30); a drain hole (30a) located at the bottom of the recess (30) of a nozzle head (32), and configured to discharge the liquid droplets as a target to be removed out of the recess (30); and a controller configured to control the discharge state of a gas discharge nozzle (33) such that there is a period in which a gas is discharged from the gas discharge nozzle (33) at a flow rate, at which the gas discharged does not reach a surface to be processed of s substrate W, in a period from the end of the rinsing process using a treatment liquid to the start of the drying process using the gas.

11 Claims, 21 Drawing Sheets

(51) Int. Cl.
*B08B 3/10* (2006.01)
*B08B 3/08* (2006.01)

(58) Field of Classification Search
CPC ......... H01L 21/67051; H01L 21/67028; H01L 21/6708; H01L 21/6715; B08B 3/02; B08B 3/08; B08B 3/10; B08B 2203/0288
See application file for complete search history.

(56) References Cited

U.S. PATENT DOCUMENTS

| | | |
|---|---|---|
| 2010/0200547 A1 | 8/2010 | Higashijima et al. |
| 2014/0116478 A1* | 5/2014 | Higashijima ..... H01L 21/67051 134/104.2 |
| 2014/0116480 A1* | 5/2014 | Higashijima ..... H01L 21/67051 134/153 |
| 2015/0090694 A1 | 4/2015 | Hashimoto et al. |

FOREIGN PATENT DOCUMENTS

| | | |
|---|---|---|
| JP | 2005-243940 A | 9/2005 |
| JP | 2008-253862 | 10/2008 |
| JP | 2010-186859 A | 8/2010 |
| JP | 2010-219119 A | 9/2010 |
| JP | 2013-211377 A | 10/2013 |
| TW | 498396 B | 8/2002 |

OTHER PUBLICATIONS

Chinese Office Action dated Dec. 16, 2019 in corresponding Chinse Patent Application No. 201580053001.5 (9 pages).

* cited by examiner

SUBSTRATE PROCESSING APPARATUS

TECHNICAL FIELD

Embodiments described herein relate generally to a substrate processing apparatus.

BACKGROUND ART

A substrate processing apparatus is used in the process of manufacturing semiconductors, liquid crystal panels, and the like to supply a treatment solution (e.g., chemical solution such as resist stripping solution and etchant, etc., a rinsing liquid such as pure water, etc.) to a surface of a substrate, such as a wafer or a liquid crystal substrate, to thereby treat the surface.

Among such substrate processing apparatuses are those that perform spinning process in which they rotate a substrate horizontally and supply a treatment solution to substantially the center of a surface of the substrate from a nozzle so that the treatment solution is spread over the surface by centrifugal force of the rotation. Further, there have also been developed apparatuses that supply a chemical solution by spraying it from the nozzle to the back surface of a rotating substrate in addition to the surface thereof to treat both the surfaces of the substrate.

After the above-described process has been performed on the substrate, both the surfaces of the substrate are subjected to cleaning process and cleaned with a rinsing liquid such as pure water, etc. Thereafter, drying process is performed to remove the rinsing liquid remaining on the substrate by rotating the substrate.

When the cleaning process and the drying process are performed on the back surface of the substrate, a rinsing liquid or a gas used for the drying process is discharged from a nozzle provided to the nozzle head. That is, the nozzle is arranged at a position facing the back surface which is the surface to be processed of the substrate. In addition, the nozzle head has a recess having a cross-sectional shape of an inverted cone with its opening toward the back surface.

PRIOR ART DOCUMENT

Patent Document

[Patent Document 1] Japanese Unexamined Patent Application Publication No. 2005-217138

SUMMARY OF THE INVENTION

Problems to be Solved by the Invention

However, in the conventional substrate processing apparatus, the following points are not taken into consideration.

That is, a chemical solution or a rinsing liquid containing the chemical solution flowing down from the back surface of the substrate when the cleaning process is performed thereon, or the chemical solution from a nozzle or the like that discharges the chemical solution may possibly become droplets and stays in the recess. Particularly, if the tip of the nozzle protrudes more or less from the surface of the recess, the droplets tend to stay in the vicinity of the nozzle.

Upon completion of the cleaning process, next comes the drying process on the back surface of the substrate. At that time, gas is discharged from the nozzle to promote the drying process. While the gas is being discharged from the nozzle, if the droplets stay on the surface of the recess or in the vicinity of the nozzle that discharges the chemical solution, the droplets diffuses in the form of mist due to the gas discharged from the nozzle. When this misty solution adheres again to the back surface of the substrate, it makes a water stain (water mark).

An object of the present invention is to provide a substrate processing apparatus that reliably removes droplets present in the recess of the nozzle head or prevents droplets from remaining in the recess, thereby being able to reduce the occurrence of water stain due to re-adhesion in the substrate processing.

Means of Solving the Problems

According to one embodiment, a substrate processing apparatus including a nozzle head that faces a surface to be processed of a substrate and has a recess with its opening toward the surface to be processed, a treatment liquid supply nozzle provided to the nozzle head and configured to supply a treatment liquid to the surface to be processed, and a gas discharge nozzle configured to discharge a gas to the surface to be processed, the substrate processing apparatus configured to perform a process using the treatment liquid and a drying process using the gas, the substrate processing apparatus comprising: a removing part configured to remove liquid droplets present in the recess; a drain part located at the bottom of the recess of the nozzle head, and configured to discharge the liquid droplets as a target to be removed out of the recess; and a controller configured to control the discharge state of the gas discharge nozzle such that there is a period in which a gas is discharged from the gas discharge nozzle at a flow rate, at which the gas discharged does not reach the surface to be processed of the substrate, in a period from the end of rinsing process using the treatment liquid to the start of the drying process using the gas.

Effects Of The Invention

According to the embodiment, it is possible to reduce the occurrence of water stains due to re-adhesion in the substrate processing by reliably removing droplets present in the recess of the nozzle head or preventing droplets from remaining in the recess.

MODES FOR CARRYING OUT THE INVENTION

Figure 1:
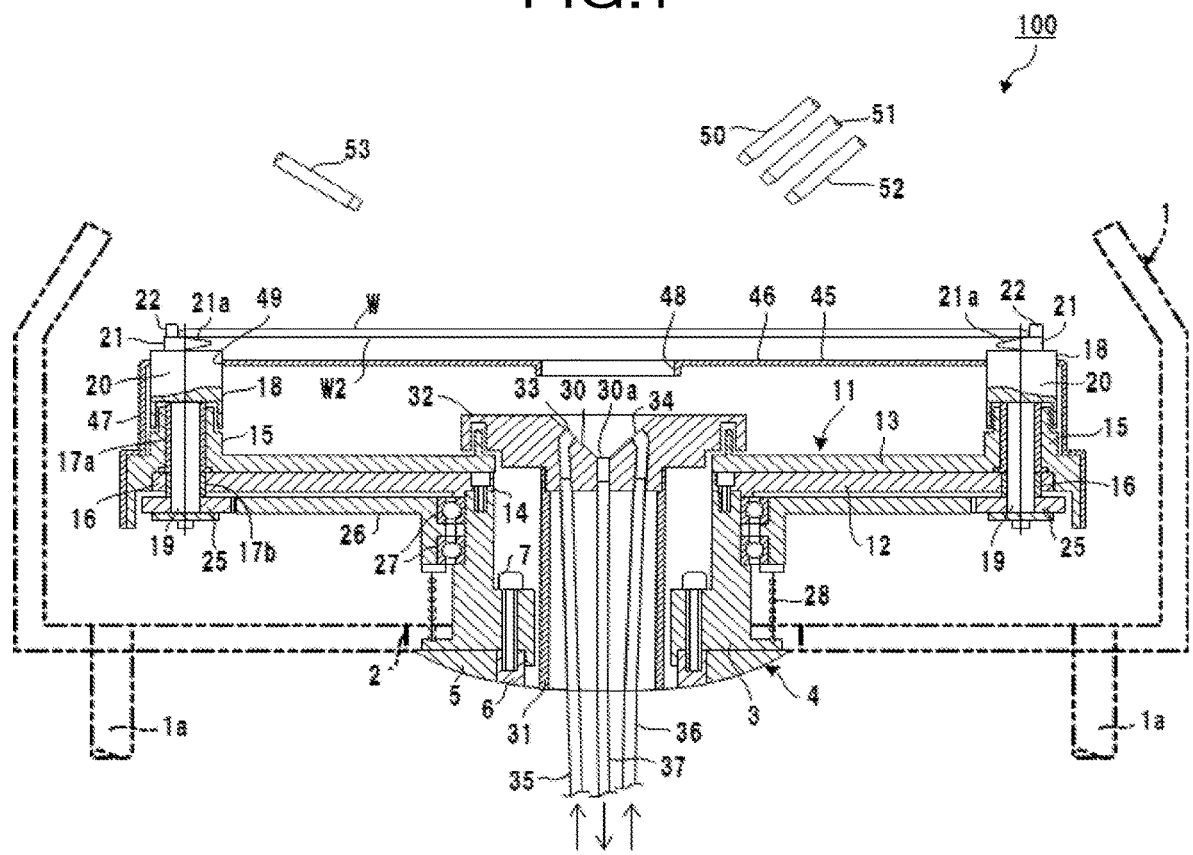
FIG. 1 is a cross-sectional view illustrating a schematic configuration of a spin processing apparatus as a substrate processing apparatus according to an embodiment of the present invention.

Referring now to the drawings, illustrative embodiments will be described in detail.

FIG. 1 is a cross-sectional view illustrating a schematic configuration of a spin processing apparatus 100 as a substrate processing apparatus according to an embodiment of the present invention.

The spin processing apparatus 100 has a cup body 1 indicated by a dashed-two dotted line in FIG. 1. A through hole 2 is provided in the radial center of the bottom of the cup body 1. A plurality of discharge pipes 1a are connected to the periphery at regular intervals in the circumferential direction.

The through hole 2 is provided with a cylindrical power transmission body 3. The power transmission body 3 is rotationally driven by a control motor 4 as a driving unit. The control motor 4 has a cylindrical stator 5 and a cylindrical rotor 6 that is rotatably inserted in the stator 5.

The lower end of the power transmission body 3 is brought into contact with the upper end surface of the rotor 6, and this portion is fixed by a screw 7. Accordingly, the power transmission body 3 rotates integrally with the rotor 6. Incidentally, the rotational speed of the control motor 4 is controlled by a controller 8 (see FIG. 2).

The power transmission body 3 has an upper end portion protruding into the cup body 1, and a rotary table 11 is attached thereto. The rotary table 11 is formed by laminating a disk-shaped lower plate 12 and an upper plate 13. A through hole 14 is formed in a central portion between the lower plate 12 and the upper plate 13. The through hole 14 communicates with the internal space of the power transmission body 3.

On the peripheral portion of the upper plate 13 of the rotary table 11, four support cylindrical portions 15 are integrally formed at regular intervals, for example, at intervals of 90 degrees, in the circumferential direction. A through hole 16 is formed in a portion of the lower plate 12 corresponding to each of the support cylindrical portions 15.

Bushings 17a and 17b are fitted to the support cylindrical portion 15 and the through hole 16, respectively. Holding members 18 are each rotatably supported by the bushings 17a and 17b. Each of the holding members 18 has a shaft portion 19 supported by the bushings 17a and 17b, and a head portion 20 having a larger diameter than the shaft portion 19. The head portion 20 is integrally formed with the upper end portion of the shaft portion 19.

On an upper end surface of the head portion 20, a tapered member 21 is arranged at a position eccentric from the rotation center of the shaft portion 19. The tapered member 21 is provided with an engaging pin 22 that protrudes from the upper end portion of a tapered surface 21a in the inclination direction.

A substrate W such as a semiconductor wafer is arranged on the tapered member 21 provided on each of the holding members 18 such that the peripheral portion of the back surface W2 is placed on the tapered surface 21a. In this state, when each of the holding members 18 is rotated in a predetermined direction, for example, clockwise, the tapered member 21 rotates eccentrically. As a result, the peripheral portion of the substrate W is raised along the tapered surface 21a of the tapered member 21, and its outer peripheral surface abuts against the engaging pin 22. Thus, the substrate W is integrally held on the rotary table 11 by the four holding members 18.

When the holding members 18 are rotated in the opposite direction, counterclockwise, the engaging pin 22 rotates eccentrically in a direction away from the outer peripheral surface of the substrate W. Thereby, the substrate W is released from the held state by the four holding members 18.

As illustrated in FIG. 1, a lower end of the shaft portion 19 of each of the holding members 18 protrudes toward the lower surface side of the rotary table 11. A child gear 25 is fixed to the protruding end portion. The child gear 25 fixed to the shaft portion 19 of each of the holding members 18 meshes with a parent gear 26. The parent gear 26 is rotatably held on the power transmission body 3 via a bearing 27.

The parent gear 26 is urged in a predetermined rotation direction, for example, counterclockwise direction, by a spring 28 provided on the outer peripheral surface of the power transmission body 3. As a result, the child gear 25 rotates in the clockwise direction. The holding members 18 move in conjunction with the rotation, and the tapered member 21 eccentrically rotates. Thereby, the substrate W is held on the rotary table 11 by the engaging pin 22 of each of the holding members 18.

To release the held state of the substrate W, the parent gear 26 is rotated in the clockwise direction against the urging force of the spring 28 by a releasing mechanism (not illustrated). Specifically, the parent gear 26 is prevented from rotating by the releasing mechanism, and in this state, the rotary table 11 is rotated counterclockwise by the control motor 4. As a result, the holding members 18 rotate counterclockwise. Thus, the held state of the substrate W by the engaging pin 22 is released.

A holding cylinder 31 fixed to the main body of the spin processing apparatus 100 is inserted in the power transmission body 3. A nozzle head 32 is attached to the upper end of the holding cylinder 31. The nozzle head 32 includes a recess 30 formed to have an inverted conical shape or a mortar shape ("hereinafter all referred to as "inverted conical shape") with an opening on the upper surface. Since the holding cylinder 31 is separated from the power transmission body 3, the nozzle head 32 does not rotate even if the rotary table 11 and the like rotate.

The nozzle head 32 is provided with a gas discharge nozzle 33 for discharging a gas such as nitrogen gas toward the center of the back surface W2 of the substrate W held by the rotary table 11, a pure water discharge nozzle 34 for discharging pure water as a rinsing liquid, a first chemical solution discharge nozzle 40 (see FIG. 3) for discharging a chemical solution such as an etchant and the like, and a second chemical solution discharge nozzle 41 (see FIG. 3) for discharging a chemical solution (SC-1 solution) containing ammonia water and hydrogen peroxide, for example. The discharge nozzles are formed with their tips opened on the surface of the recess 30.

The pure water discharge nozzle 34, the first chemical solution discharge nozzle 40, and the second chemical solution discharge nozzle 41 constitute a treatment liquid supply nozzle. Besides, in the nozzle head 32, a drain hole 30a is formed with its tip opened at the lowermost end of the inner surface of the recess 30.

An air supply pipe 35 is connected to the rear end of the gas discharge nozzle 33. A pure water supply pipe 36 is connected to the rear end of the pure water discharge nozzle 34. Further, a drain pipe 37 is connected to the drain hole 30a, and the drain hole 30a and the drain pipe 37 constitute a drain portion. Although not illustrated, a first chemical solution supply pipe and a second chemical solution supply pipe are connected to the rear ends of the first chemical solution discharge nozzle 40 and the second chemical solution discharge nozzle 41, respectively.

Figure 2:
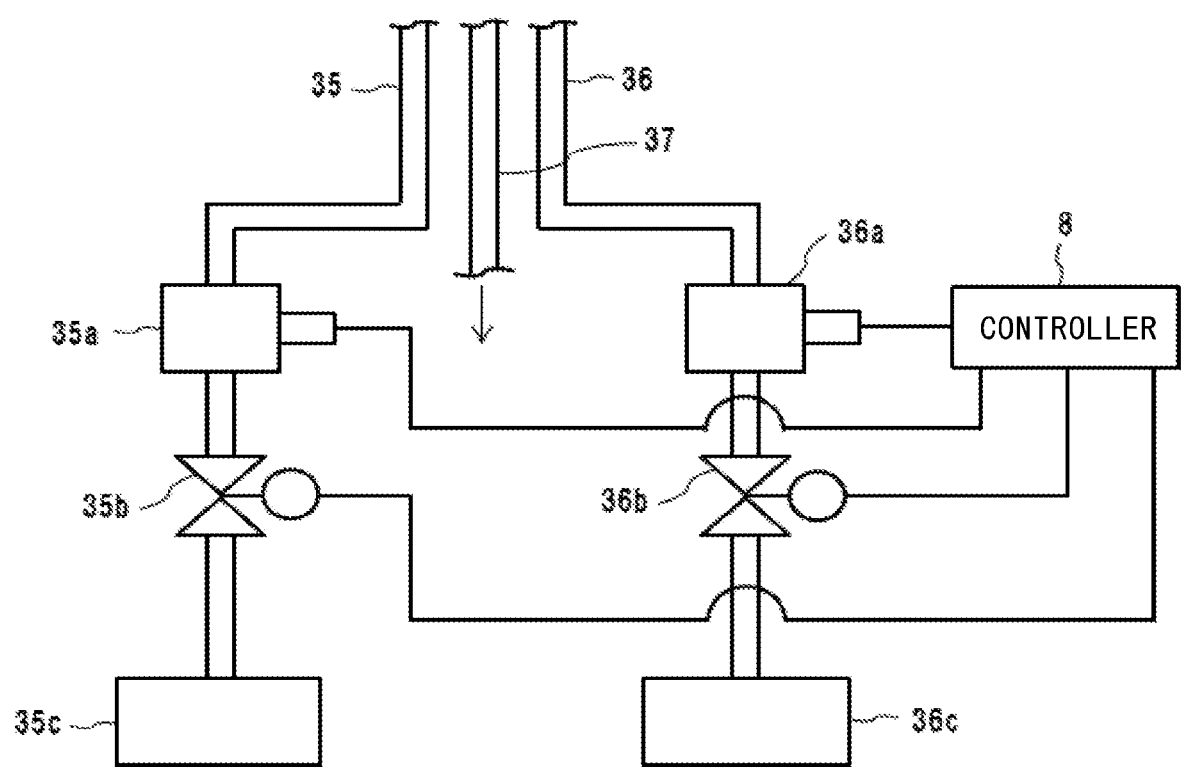
FIG. 2 is a diagram illustrating a piping system used in the substrate processing apparatus illustrated in FIG. 1.

As illustrated in FIG. 2, the air supply pipe is connected to a gas supply source 35c, which supplies a gas such as nitrogen gas to the gas discharge nozzle 33, via a flow rate control valve 35a and an open/close valve 35b. Accordingly, when the open/close valve 35b is opened, gas is discharged from the gas discharge nozzle 33, while when the open/close valve 35b is closed, the discharge of the gas is stopped. The flow rate of the gas at the time of discharge is set by the flow rate control valve 35a.

The pure water supply pipe 36 is connected to a rinsing liquid supply source 36c for supplying a rinsing liquid (pure water, etc.) to the pure water discharge nozzle 34 via a flow rate control valve 36a and an open/close valve 36b. Accordingly, when the open/close valve 36b is opened, pure water is discharged from the pure water discharge nozzle 34, while when the open/close valve 36b is closed, the discharge of pure water is stopped. The flow rate of the rinsing liquid at the time of discharge is set by the flow rate control valve 36a.

Although not illustrated, the first chemical solution supply pipe is connected to a supply source for supplying a chemical solution such as an etchant to the first chemical solution discharge nozzle 40 via a flow rate control valve and an open/close valve. The second chemical solution supply pipe is connected to a supply source for supplying a chemical solution such as SC-1 solution to the chemical solution discharge nozzle 41 via a flow rate control valve and an open/close valve. Although the details will be described later, the flow rate control valve and the open/close valve provided in the middle of the pipe are controlled by the controller 8.

The upper surface and the outer peripheral surface of the rotary table 11 are covered with a cover 45 that is integral with the rotary table 11. The cover 45 has an opposing wall 46 that faces the back surface W2 of the substrate W held by the rotary table 11 and a peripheral wall 47 provided perpendicular to the periphery of the opposing wall 46.

An opening 48 is formed in the opposing wall 46 such that gas such as nitrogen gas discharged from the gas discharge nozzle 33, pure water discharged from the pure water discharge nozzle 34, and chemical solution discharged from the first and second chemical solution discharge nozzles 40 and 41 can reach the back surface W2 of the substrate W.

The upper end portions of the four holding members 18 provided on the upper surface of the rotary table 11 protrude toward the upper surface side from a through hole 49 provided so as to penetrate the opposing wall 46 of the cover 45.

Similarly to the back surface W2 side of the substrate W, a first upper nozzle body 50 for discharging a chemical solution such as an etchant to the substrate W, a second upper nozzle body 51 for discharging a chemical solution such as SC-1 solution, a third upper nozzle body 52 for discharging pure water as a rinsing liquid, and a fourth upper nozzle body 53 for discharging a gas such as nitrogen gas are arranged above the rotary table 11.

In the following, a description will be given of the operation of the spin processing apparatus 100 having the above configuration for treating the substrate W. The treatment of the substrate W in this embodiment includes an etching step, a chemical cleaning step, a rinsing step, and a drying step. In addition, all the operation is controlled by the controller 8.

The controller 8 includes a microcomputer that intensively controls each unit, and a storage that stores substrate processing information related to substrate processing, various programs, and the like. The controller 8 performs the following control based on the substrate processing information and the programs.

First, the substrate W is held on the rotary table 11, and the rotary table 11 is rotated at a low speed of several tens to several hundreds r.p.m. While the rotary table 11 is rotating, etchant is supplied to the front surface W1 (upper surface) and the back surface W2 (lower surface) of the substrate W from the first chemical solution discharge nozzle 40 and the first upper nozzle body 50. The etchant supplied to the substrate W is thrown to the outer periphery of the substrate W by centrifugal force and spreads over the entire surface of the substrate. When the etching process is completed after a lapse of a predetermined time from the start of supply of the etchant, the supply of the etchant is stopped. Next, from the second chemical solution discharge nozzle 41 and the second upper nozzle body 51, SC-1 solution is supplied to the front surface W1 and the back surface W2 of the substrate W. This removes the etchant remaining on the substrate W.

After treating the substrate W with the SC-1 solution, the supply of the SC-1 solution is stopped. Next, pure water is supplied to the front surface W1 and the back surface W2 of the substrate W from the pure water discharge nozzle 34 and the third upper nozzle body 52. Thereby, a rinsing step is performed to remove the SC-1 solution remaining on the front and back surfaces of the substrate W.

Finally, the rotary table 11 is rotated at a high speed of several thousands r.p.m, and a gas such as nitrogen gas is blown to the front surface W1 and the back surface W2 of the substrate W from the gas discharge nozzle 33 and the fourth upper nozzle body 53. With this, the treatment liquid remaining on the substrate W is blown off from the front and back surfaces of the substrate W, and drying process is performed.

The chemical solution and the rinsing liquid supplied to the front surface W1 of the substrate W are thrown outward by centrifugal force due to the rotation of the substrate W and are collected from the discharge pipes 1a after colliding with the inner surface of the cup body 1. On the other hand, although the chemical solution and the rinsing liquid supplied to the back surface W2 of the substrate W are also thrown out by centrifugal force, part of the chemical solution and the rinsing liquid supplied to the back surface W2 are scattered in the recess 30, and flows out from the drain hole 30a.

Meanwhile, in a substrate processing apparatus represented by the spin processing apparatus 100 as described above, when the chemical solution or the rinsing liquid containing the chemical solution stays as droplets in the recess 30, water stains (watermarks) are formed on the back surface of the substrate as mentioned above. In the following, embodiments for preventing such occurrence will be described in order.

Figure 3:
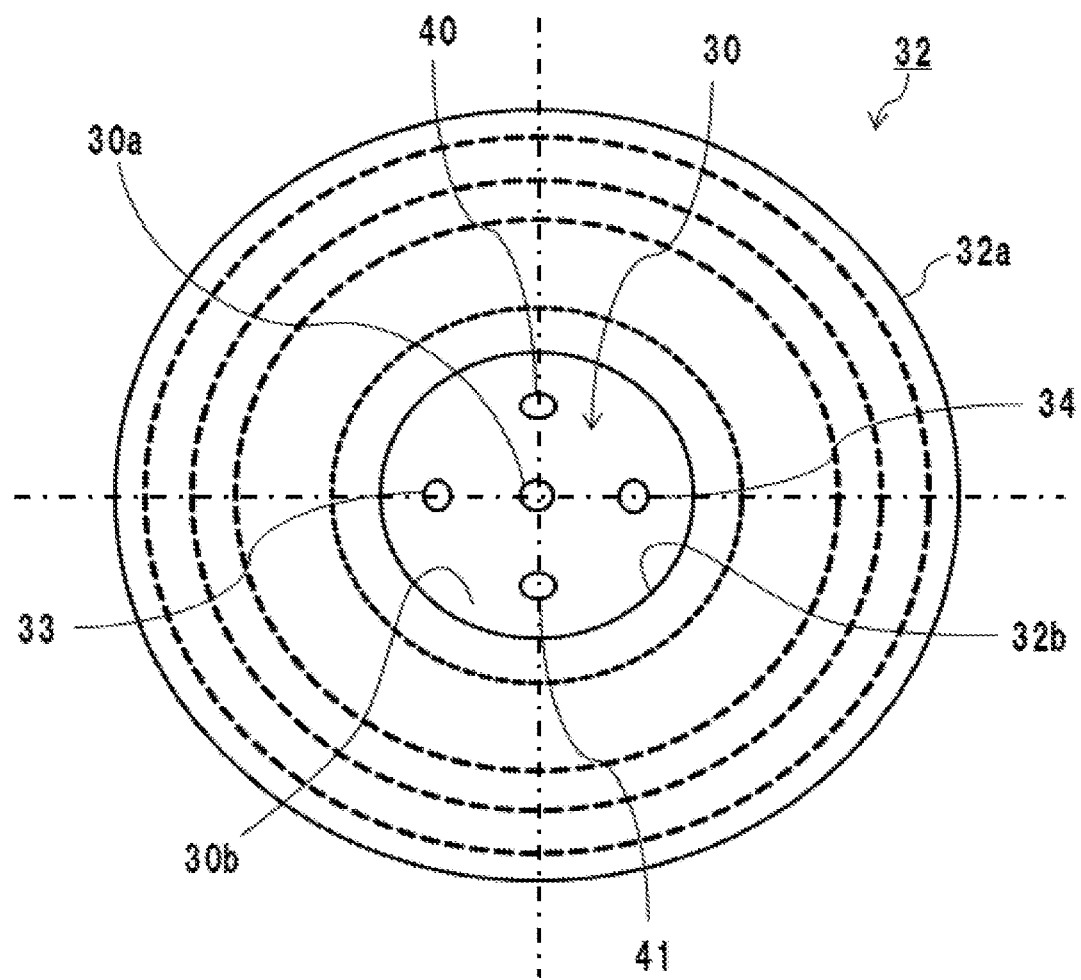
FIG. 3 is an enlarged plan view illustrating a nozzle head constituting a substrate processing apparatus of a first embodiment viewed from a substrate side.

FIG. 3 is an enlarged plan view illustrating the nozzle head 32 of the substrate processing apparatus 100 of the first embodiment viewed from the substrate W side. In FIG. 3, the outermost line indicates an outer edge 32a of the nozzle head 32. A line inside it indicates an inner edge 32b of the nozzle head 32, which is the upper end of an inclined surface 30b of the recess 30. On the inside of the inner edge 32b, the drain hole 30a formed in the bottom of the recess is illustrated in the center in FIG. 3.

The plan view of FIG. 3 illustrates the four nozzles provided on the inclined surface 30b. As illustrated in FIG. 3, on the left side of the drain hole 30a, the gas discharge nozzle 33 is provided for discharging a gas toward the back surface W2. The pure water discharge nozzle 34 is provided at a position facing the gas discharge nozzle 33 across the drain hole 30a for discharging pure water toward the back surface W2. In addition, the first chemical solution discharge nozzle 40 is provided above the drain hole 30a in FIG. 3 for discharging a chemical solution such as an etchant or the like. Further, the second chemical solution discharge nozzle 41 is provided below the drain hole 30a for discharging a chemical solution such as SC-1 solution or the like.

Besides, in FIG. 3, center lines perpendicular to each other are indicated by dot-and-dash line lines so as to pass through the center of the drain hole 30a. Each of the four nozzles described above is arranged so that its center is located on one of the center lines.

Incidentally, in this embodiment, the number of the various nozzles and the location are as illustrated in the plan view of FIG. 3; however, the number and location can be arbitrarily set.

Further, in the explanation, the mechanism and configuration for removing liquid droplets will be hereinafter referred to as "removing part D".

Figure 4:
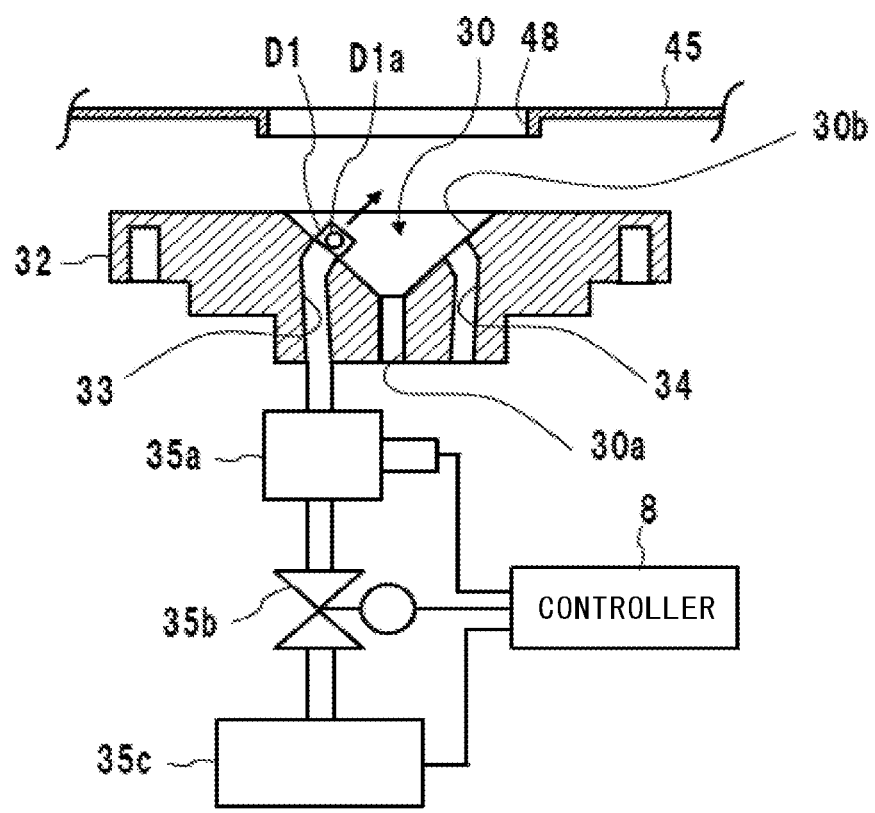
FIG. 4 is a schematic sectional view illustrating a configuration of a removing part according to the first embodiment.

FIG. 4 is a schematic sectional view illustrating a configuration of the removing part D1 according to the first embodiment. The removing part D1 illustrated in FIG. 4 is referred to as "first nozzle D1" for the sake of convenience. The first nozzle D1 employs the configuration of the gas discharge nozzle 33. Accordingly, the first nozzle D1 also plays a role of discharging a gas to the back surface W2 to promote drying of the back surface W2 in the drying process by the gas discharge nozzle 33.

Therefore, as illustrated in FIG. 4, the discharge port of the first nozzle D1 is configured such that its one end protrudes from the inclined surface 30b of the recess 30. Even with the use of the configuration in which the one end of the first nozzle D1 slightly protrudes as just described, as long as it is guaranteed that a gas is properly discharged to the back surface W2, it does not cause an adverse effect on the drying process.

A hole D1a is newly provided on the one end side of the first nozzle D1 protruding from the inclined surface 30b. Since the discharge port for discharging a gas to the back surface W2 is provided to the one end of the first nozzle D1, the gas discharged from the discharge port is oriented in the direction indicated by the arrow in FIG. 4.

Specifically, the hole D1a is arranged in a direction that is perpendicular to the discharge direction of the gas from the discharge port (direction indicated by the arrow in FIG. 4) in a position where the gas can be discharged toward the recess 30. In FIG. 4, the hole D1a is located at a position where its opening is seen in the front.

The opening of the hole D1a has a diameter determined such that the power of the gas discharged for drying in the arrow direction toward the back surface W2 from the discharge port is not diminished by the discharge of the gas from the hole D1a.

As described with reference to FIG. 2, the gas discharge nozzle 33 is connected to the gas supply source 35c via the flow rate control valve 35a and the open/close valve 35b. The controller 8 regulate the flow rate control valve 35a to adjust the amount of the gas discharged from the one end of the first nozzle D1 and the amount of the gas discharged from the hole D1a of the first nozzle D1, and switches the open/close valve 35b to adjust the discharge timing of the gas.

More specifically, the controller 8 switches the flow amount (flow rate) of the gas discharged from the one end of the first nozzle D1 between at least two different rates, i.e., first flow rate and second flow rate. The first flow rate is a level of flow rate at which the gas discharged from the one end of the first nozzle D1 does not reach the back surface W2 of the substrate W, but the gas discharged from the hole D1a of the first nozzle D1 can move in a whirl or spiral in the circumferential direction of the recess 30 along the inclined surface 30b of the recess 30. On the other hand, the second flow rate is a flow rate of the gas discharged from the one end of the first nozzle D1 sufficient to perform the drying process of the back surface W2 of the substrate. Accordingly, the first flow rate is far less than the second flow rate.

In this embodiment, the open/close valve 35b is closed during the etching step, the chemical cleaning step, and the rinsing step described above. Then, the open/close valve 35b is switched to open in a period from the completion of the rinsing step to the start of the drying step. When the open/close valve 35b is switched the open position, first, the flow rate of the gas discharged from the one end of the first nozzle D1 is set to the first flow rate. The recess 30 is formed in an inverted conical shape. Therefore, by providing the hole D1a, the gas is discharged from the hole D1a, and moves along the inclined surface 30b of the recess 30 in the circumferential direction. Thus, droplets present in the recess 30 can be moved to the drain hole 30a. That is, in this embodiment, a gas such as nitrogen gas used for drying the substrate functions as a removing material.

When a predetermined time has elapsed in this state, the flow rate of the gas discharged from the one end of the first nozzle D1 is switched to the second flow rate. As a result, the gas is discharged at the second flow rate from the one end of the first nozzle D1 to the back surface W2 of the substrate W rotating at a high speed, and the drying step is performed. At this time, the gas is kept discharged also from the hole D1a of the first nozzle D1. When the drying step is completed, the open/close valve 35b is closed, and the discharge of the gas from the first nozzle D1 and the hole D1a is stopped.

As described above, in this embodiment, even if the chemical solution or the rinsing liquid containing the chemical solution remains in the recess 30 as droplets, the droplets can be moved by the gas discharged from the hole D1a of the first nozzle D1 along the inclined surface 30b and guided to the drain hole 30a. Thus, it is possible to prevent inconvenience (occurrence of water stains, etc.) such as adhesion of a chemical solution to the substrate during the drying step.

Since the gas (inert gas, etc.) used for promoting the drying of the back surface W2 can also be used to remove droplets present in the recess 30, there is no need to prepare extra gas for removing the droplets.

Further, after the end of the rinsing step and before the start of the drying step, first, the flow rate of the gas discharged from the one end of the first nozzle D1 is set to the first flow rate such that the gas can be discharged from the one end of the first nozzle D1 even though a small amount. With this, in the treatment steps using a treatment liquid, such as the etching step, chemical cleaning step, rinsing step, and the like, even if the treatment liquid has permeated into the one end of the first nozzle D1 or the hole D1a of the first nozzle D1, the treatment liquid can be removed from both the nozzles before the drying step is started. This also prevents inconvenience such as adhesion of a chemical solution to the substrate during the drying step.

Although FIG. 4 illustrates only one hole (D1a), which faces the front, there may be a plurality of holes (D1a). For example, a plurality of holes may be provided to the first nozzle D1 so as to extend toward the inclined surface 30b at different angles to thereby discharge the gas toward the inclined surface 30b. By discharging the gas for promoting the drying of the back surface W2 to the wide range of the inclined surface 30b, droplets can be removed more efficiently.

Next, with reference to FIGS. 5 to 7, a description will be given of a removing part D2 according to a second embodiment.

In the following description, like reference numerals designate like constituent elements as those already described, and the same description will not be repeated to avoid redundancy.

Figure 5:
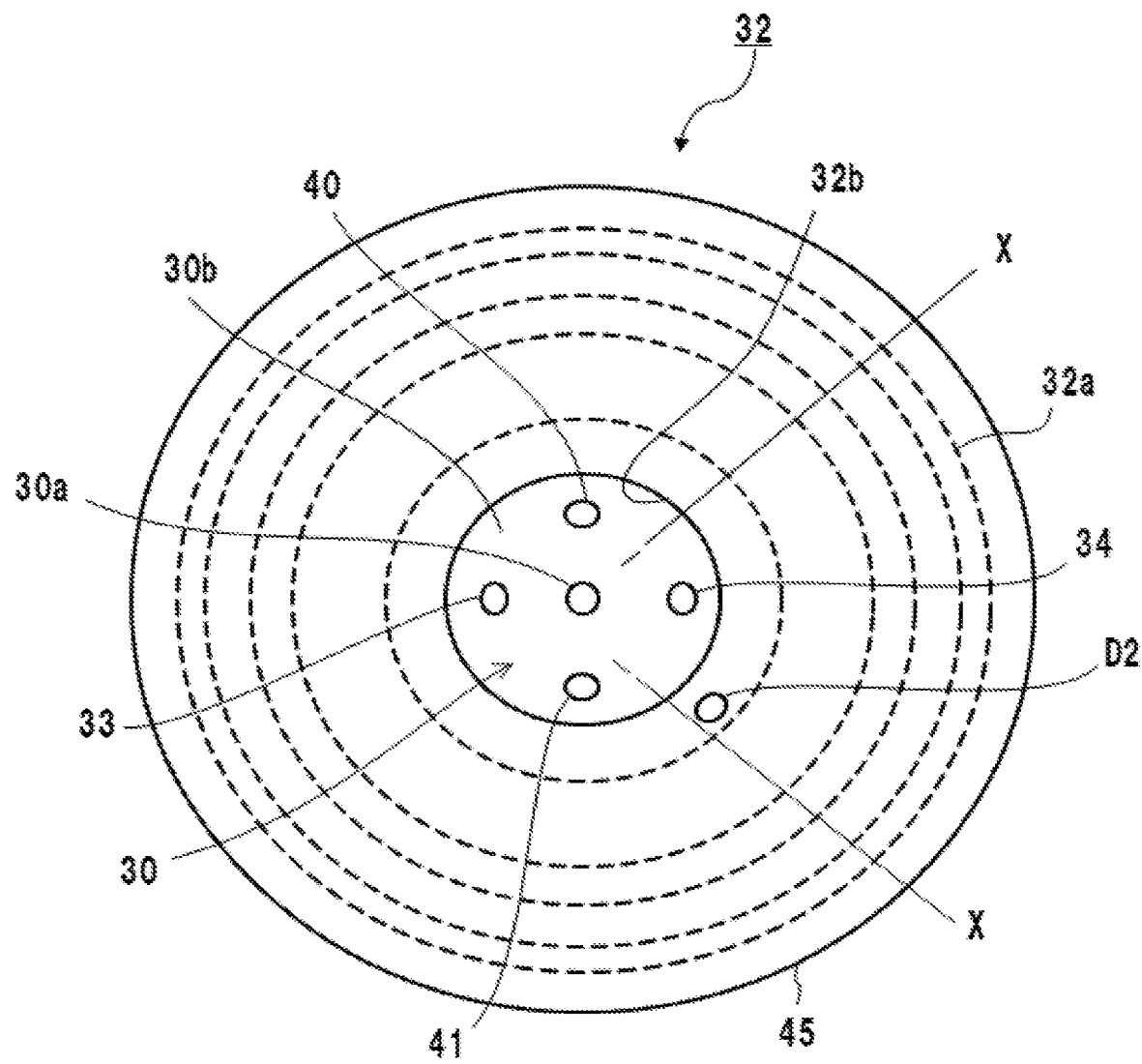
FIG. 5 is an enlarged plan view illustrating a configuration of a removing part according to a second embodiment as viewed from a substrate side.

FIG. 5 is an enlarged plan view illustrating a configuration of the removing part of the second embodiment as viewed from the substrate side.

As in the first embodiment, the removing part D2 uses the gas discharged to the back surface W2. However, the second nozzle D2 is provided separately from the gas discharge nozzle 33, and the gas is discharged from the second nozzle D2 to the recess 30.

In FIG. 5, the second nozzle D2 is formed between the pure water discharge nozzle 34 and the second chemical solution discharge nozzle 41 in the recess 30. The second nozzle D2 is a nozzle that discharges a gas toward the cover 45. In the second embodiment, a mechanism is adopted in which the direction of the gas discharged toward the cover 45 is changed to guide the gas to the recess 30.

Figure 6:
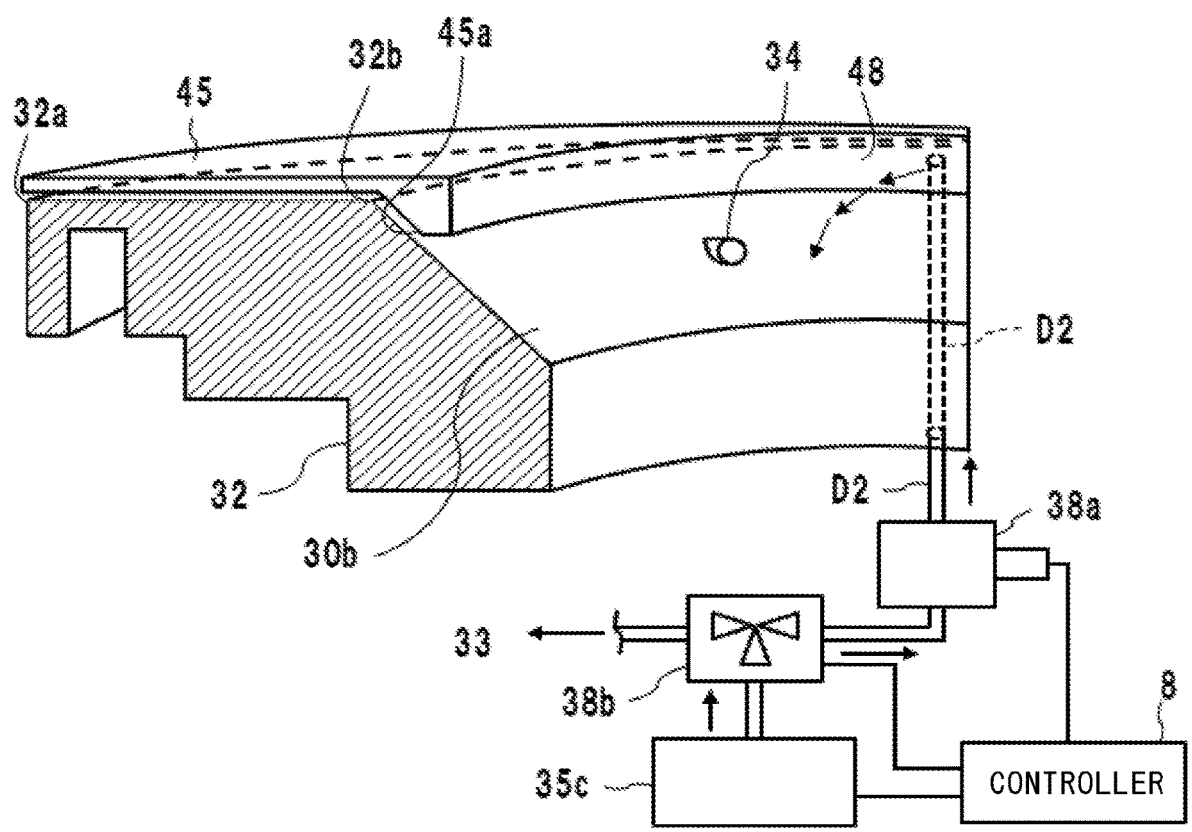
FIG. 6 is an enlarged schematic perspective view illustrating a piping system taken along the line X-X in FIG. 5.
Figure 7:
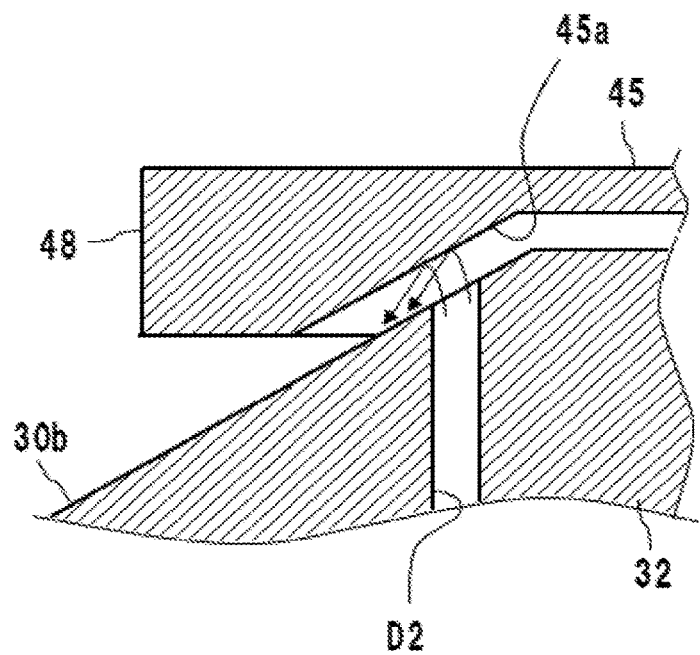
FIG. 7 is a partially enlarged view of FIG. 6.

FIG. 6 is a schematic sectional view illustrating a piping system taken along the line X-X in FIG. 5. FIG. 7 is a partial enlarged view of FIG. 6.

As illustrated in FIG. 6, the second nozzle D2 is formed so as to penetrate the interior of the nozzle head 32. One end of the second nozzle D2, which is a gas discharge port, opens to the inclined surface 30b. The other end of the second nozzle D2 is connected to the gas supply source 35c, and the gas supplied is discharged from the one end of the second nozzle D2 toward the cover 45. Although FIG. 5 illustrates only one second nozzle (D2) provided to the nozzle head 32, there may be a plurality of second nozzles D2.

In the cover 45, a turner 45a is formed over the entire circumference of the edge of the opening 48 for changing the direction of the gas discharged from the second nozzle D2 toward the cover 45. As illustrated in FIGS. 6 and 7, the turner 45a has a shape like a canopy that covers the upper portion of the inclined surface 30b. The gas discharged from the second nozzle D2 strikes against the turner 45a.

Described below are the flow of the gas discharged from the second nozzle D2 and the removal of droplets from the inclined surface 30b by the gas.

The gas discharged from the second nozzle D2 first hits the cover 45. The discharged gas hits a region including the turner 45a of the cover 45. The gas having hit the turner 45a diffuses peripherally along the turner 45a. The gas diffused by the turner 45a flows along the turner 45a and partly escapes from a gap between the nozzle head 32 and the cover 45 to the outside of the cover 45. The remaining gas flows from the top of the inclined surface 30b toward the drain hole 30a.

On the other hand, as the cover 45 and the substrate W rotate, the airflow flows in the direction of rotation. Due to this air current flow also, the gas discharged from the second nozzle D2 flows along the inclined surface 30b toward the drain hole 30a and flows in the circumferential direction of the inclined surface 30b. In FIG. 6, the arrow indicates the flow of the gas.

Because of the gas flowing in this way, liquid droplets present on the inclined surface 30b can be moved to the drain hole 30a. Thus, it is possible to remove the liquid droplets staying in the recess 30.

Since the turner 45a formed above the second nozzle D2 needs to diffuse the discharged gas and change the direction thereof, it is formed so as to reliably diffuse the gas and change the direction. Besides, as illustrated in FIG. 5, since the cover 45 is formed in a substantially disk shape, the turner 45a is also formed in a substantially disc shape.

As illustrated in FIG. 6, the second nozzle D2 is connected to the gas supply source 35c via a flow rate control valve 38a and a three-way valve 38b. The gas supply source 35c is a supply source for supplying the gas to the gas discharge nozzle 33. The three-way valve 38b is opened and closed to distribute the gas supplied from the gas supply source 35c to the second nozzle D2 and the gas discharge nozzle 33 for discharging the gas toward the back surface W2 of the substrate.

As in the first embodiment, the controller 8 switches the three-way valve 38b to open in a period from the end of the rinsing step to the start of the drying step. With this, the gas is discharged from the second nozzle D2. The gas is kept discharged also in the drying step. When the drying step is completed, the three-way valve 38b is closed and stops.

Figure 8:
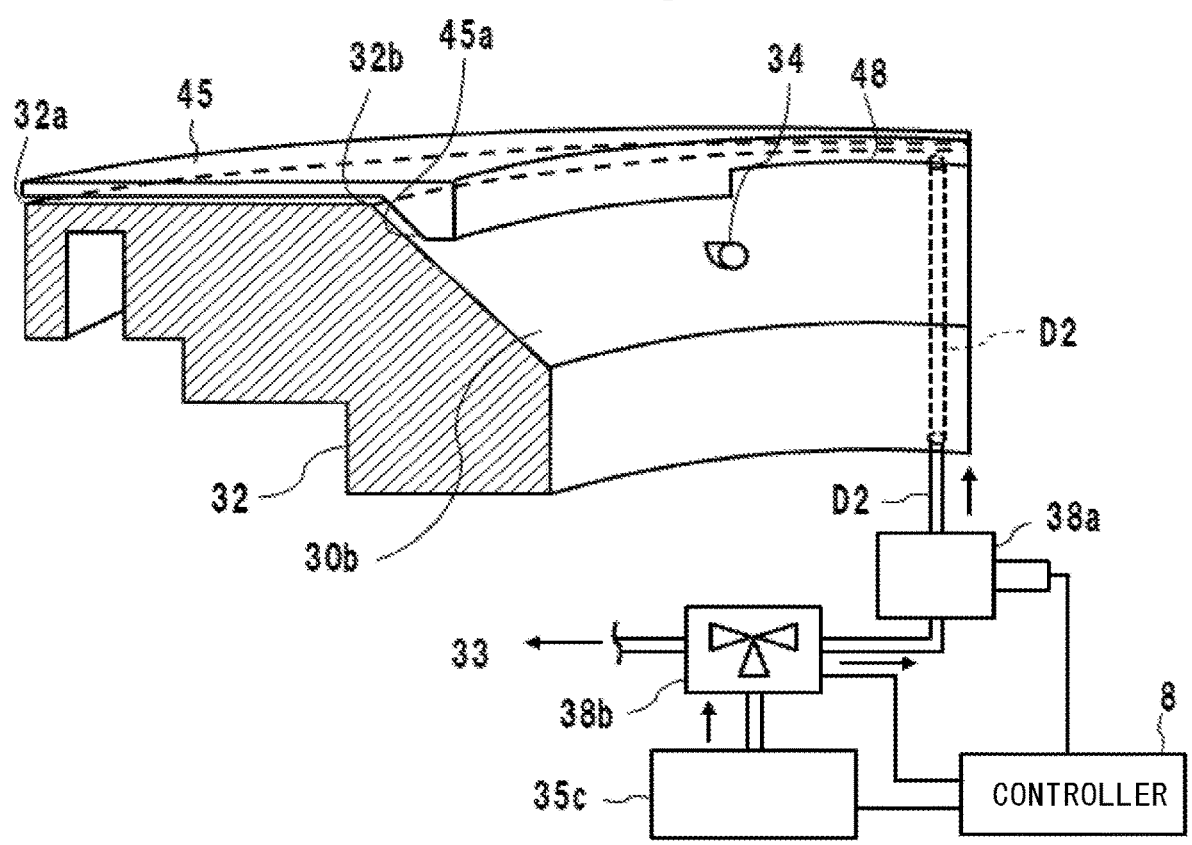
FIG. 8 is an enlarged schematic perspective view corresponding to FIG. 6 illustrating a removing part of a third embodiment.

FIG. 8 illustrates a removing part according to a third embodiment. The turner 45a may be formed only in a part of the opening 48 and not be formed in other portions.

Figure 9:
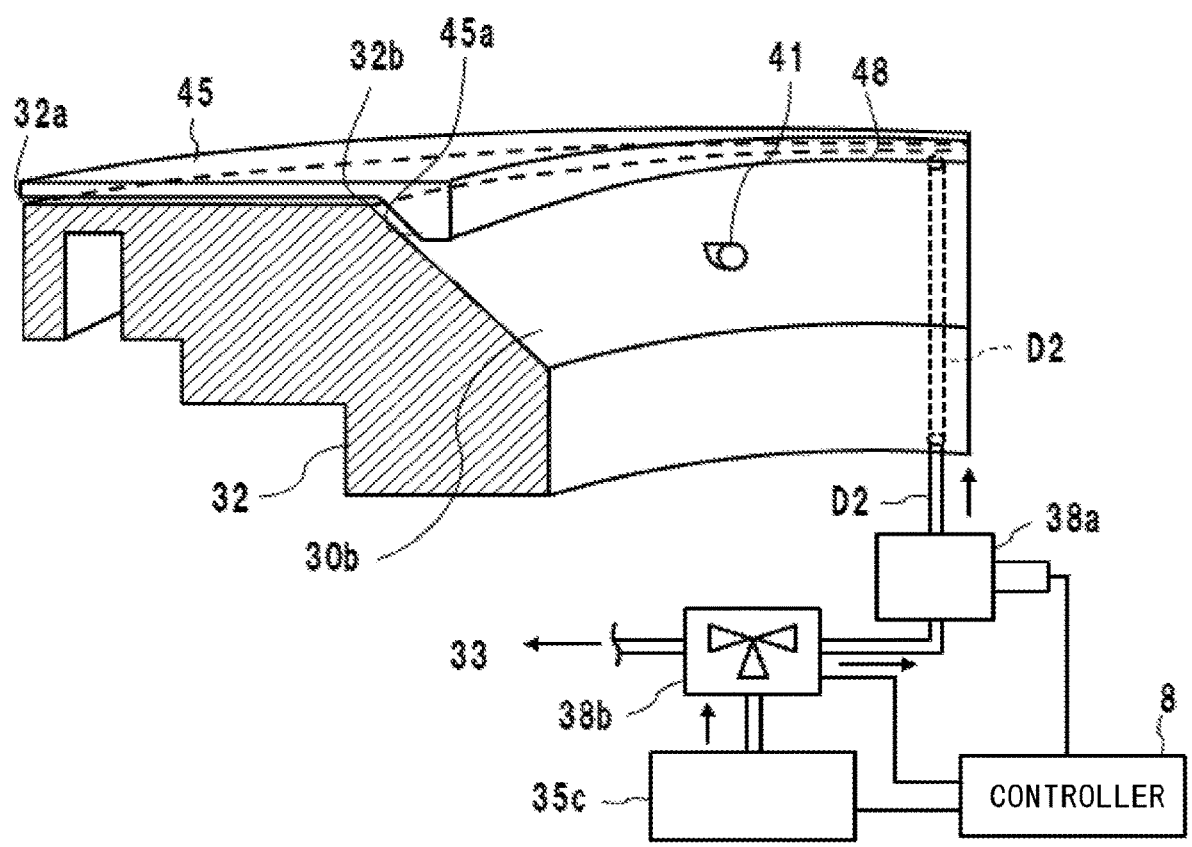
FIG. 9 is an enlarged schematic perspective view corresponding to FIG. 6 illustrating a removing part of a fourth embodiment.

FIG. 9 illustrates a removing part according to a fourth embodiment. A region where the turner 45a is clearly formed and a region where the turner 45a is not formed may be provided along the periphery of the opening 48 such that portion of the turner 45a is formed so as to gradually disappear along the circumferential direction of the opening 48 in a region located between the two regions.

As in the third and fourth embodiments, in the case where the turner 45a is provided only on a part of the periphery of the opening 48, in the region where the turner 45a is provided, as described above, the gas discharged from the second nozzle D2 is diffused and a part thereof moves so as to flow along the inclined surface 30b in the circumferential direction.

On the other hand, in the region where the turner 45a is not provided, the gas discharged from the second nozzle D2 proceeds toward the back surface W2 of the substrate W. The gas diffuses on the back surface W2, and a part thereof reaches the surface of the cover 45. The gas that has reached the surface of the cover 45 is pulled by the air flow generated between the cover 45 and the substrate W which rotate integrally, and moves on the surface of the cover 45 toward the outer circumference direction. At this time, for example, the treatment liquid adhered to the surface of the cover 45 when the back surface W2 of the substrate is cleaned is forcibly moved to the outside of the cover 45 and removed. Thus, the back surface W2 of the substrate can be kept clean.

Further, the three-way valve 38b may be regulated such that the gas is discharged (intermittently discharged) from the second nozzle D2 only when the turner 45a is positioned in the discharge direction.

Figure 10:
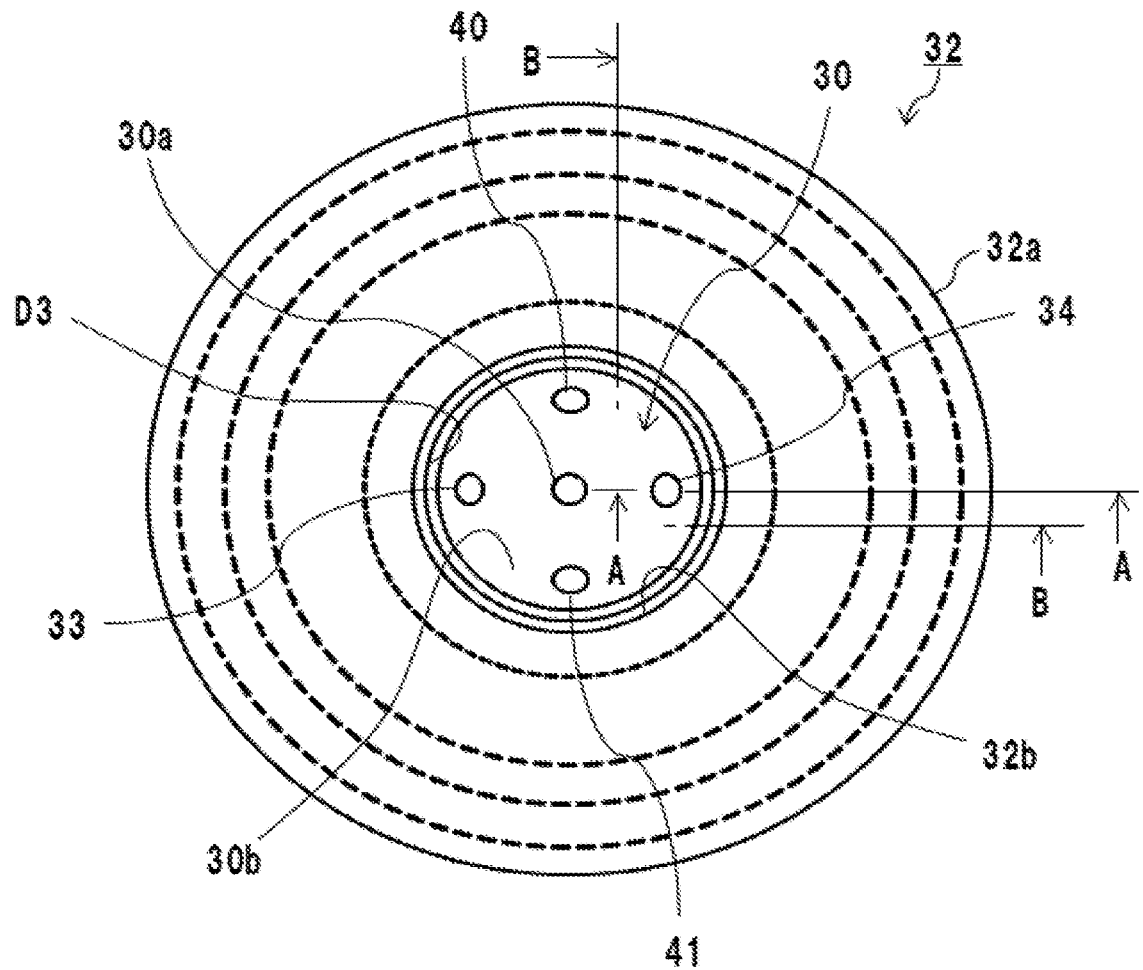
FIG. 10 is an enlarged plan view illustrating a configuration of a removing part of a fifth embodiment as viewed from a substrate side.
Figure 11:
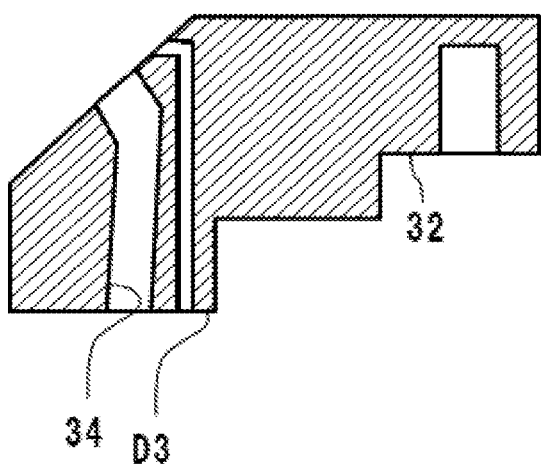
FIG. 11 is a schematic sectional view taken along the line A-A in FIG. 10.

Next, a fifth embodiment will be described with reference to FIGS. 10 to 12. FIG. 10 is an enlarged plan view illustrating a removing part D3 of the fifth embodiment as viewed from the substrate W side.

Here, liquid droplets such as a chemical solution present in the recess 30 are removed by using, for example, a liquid such as pure water as a removing material. The removing part D3, which is a discharge port for discharging pure water, is annularly provided along the periphery of the recess 30. As illustrated in the enlarged plan view of FIG. 10, the removing part D3 is arranged annularly along the inner edge 32b of the nozzle head 32 at the upper portion of the recess 30 close to the inner edge 32b. In other words, pure water flows from the highest possible position of the inclined surface 30b of the recess 30 toward the drain hole 30a. Thereby, the droplets present on the inclined surface 30b can be reliably removed.

The removing part D3 is provided to remove droplets present on the inclined surface 30b of the recess 30. In order to flow pure water along the inclined surface 30b toward the drain hole 30a, as illustrated in FIG. 11, the discharge port of the removing part D3 is formed to have the same inclination as that of the inclined surface 30b. The droplets present in the recess 30 can be removed by discharging a removing material such as pure water from the removing part D3.

In this manner, the removing part D3 removes the droplets by letting pure water flow on the inclined surface 30b. FIG. 12 illustrates a removing material supply passage D3a for supplying the removing material to the removing part D3. As illustrated in FIG. 12, the removing material supply passage D3a is formed to pass through the inside of the nozzle head 32. Further, the removing material supply passage D3a is formed annularly in the nozzle head 32 at the upper portion of the recess 30 to sufficiently supply the removing material to the removal part D3 arranged annularly along the inner edge 32b. In FIG. 12, the pure water discharge nozzle 34 is not illustrated.

Figure 12:
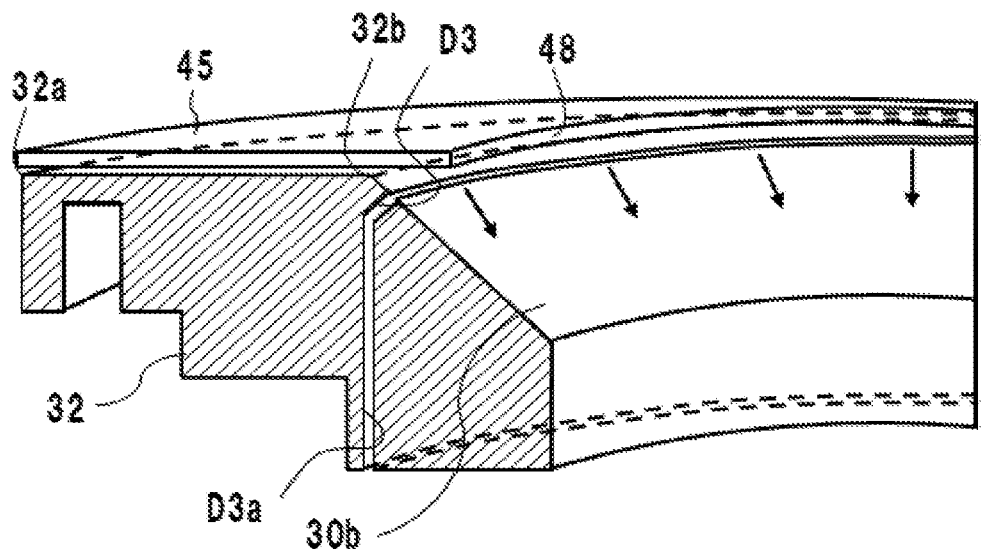
FIG. 12 is a schematic perspective view taken along the line B-B in FIG. 10.

As also illustrated in FIG. 12, the removing part D3 is arranged annularly along the inner edge 32b at the upper portion of the recess 30 close to the inner edge 32b of the nozzle head 32. In other words, a discharge port is provided between the inner edge 32b and the inclined surface 30b as a gap for allowing the removing material to flow toward the inclined surface 30b, and the removing material is discharged therefrom. That is, the gap corresponds to the removing part D3. Further, in order to supply the removing material to the entire removing part D3, the removing material supply passage D3a is also formed in a ring shape.

In such a configuration, pure water flowing out from the entire circumferential direction of the recess 30 due to the removing part D3 travels along the inclined surface 30b and linearly flows down toward the drain hole 30a, as indicated by arrows in FIG. 12. Therefore, droplets present in the recess 30. i.e., the inclined surface 30b, can be removed by using the pure water flowing down the inclined surface 30b.

Figure 13:
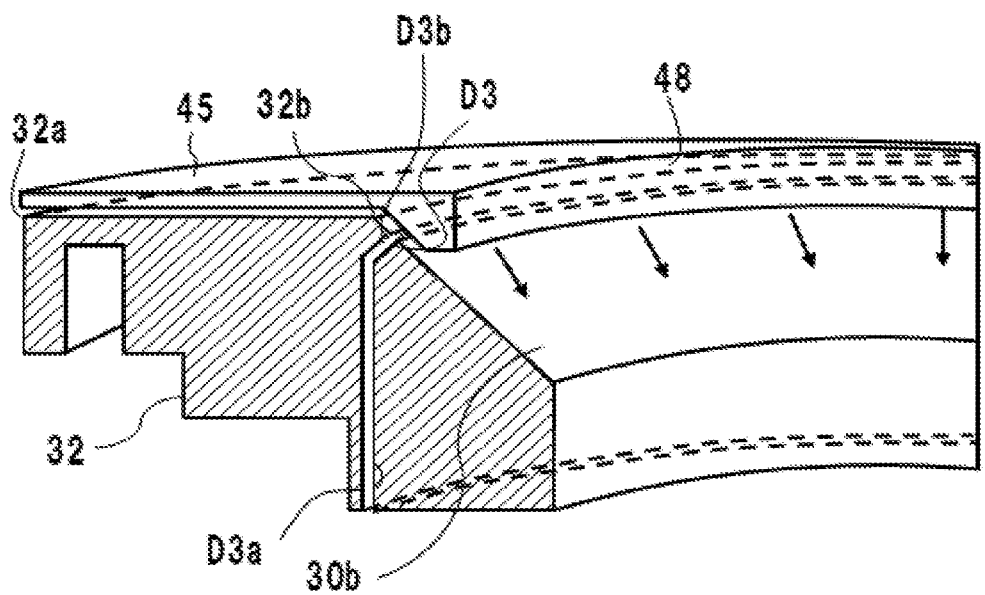
FIG. 13 is a schematic perspective view corresponding to FIG. 12 illustrating a removing part of a sixth embodiment.

FIG. 13 is a schematic perspective view illustrating the removing part D3 according to a sixth embodiment, and corresponds to FIG. 12. The difference from the removing part D3 illustrated in FIG. 12 is that an eave D3b is provided at the inner edge 32b of the nozzle head 32. Also in the removing part D3 illustrated in FIG. 13, a removing material (pure water, etc.) is discharged toward the inclined surface 30b from a gap as a discharge port provided between the inner edge 32b of the nozzle head 32 and the inclined surface 30b. However, since the eave D3b is provided to the inner edge 32b, even if pure water is discharged from the removing material supply passage D3a with a strong momentum, the pure water discharged from the removing part D3 strikes the eave D3b and falls around the inner edge 32b. Accordingly, the pure water discharged from the removing part D3 always flows from the high position of the inclined surface 30b toward the drain hole 30a. Thus, droplets present on the inclined surface 30b can be reliably removed.

Further, by providing the eave D3b, not only liquid but also gas can be used as a removing material for removing droplets present on the inclined surface 30b. That is, the gas discharged from the removing part D3 strikes against the eave D3b, thereby being blown toward the inclined surface 30b.

By providing the eave D3b in this manner, it is possible to forcibly change the direction of the removing material discharged from the discharge port. Therefore, even if the removing material is a gas, the gas discharged from the discharge port can be guided to the inclined surface 30b without being diffused.

Figure 14:
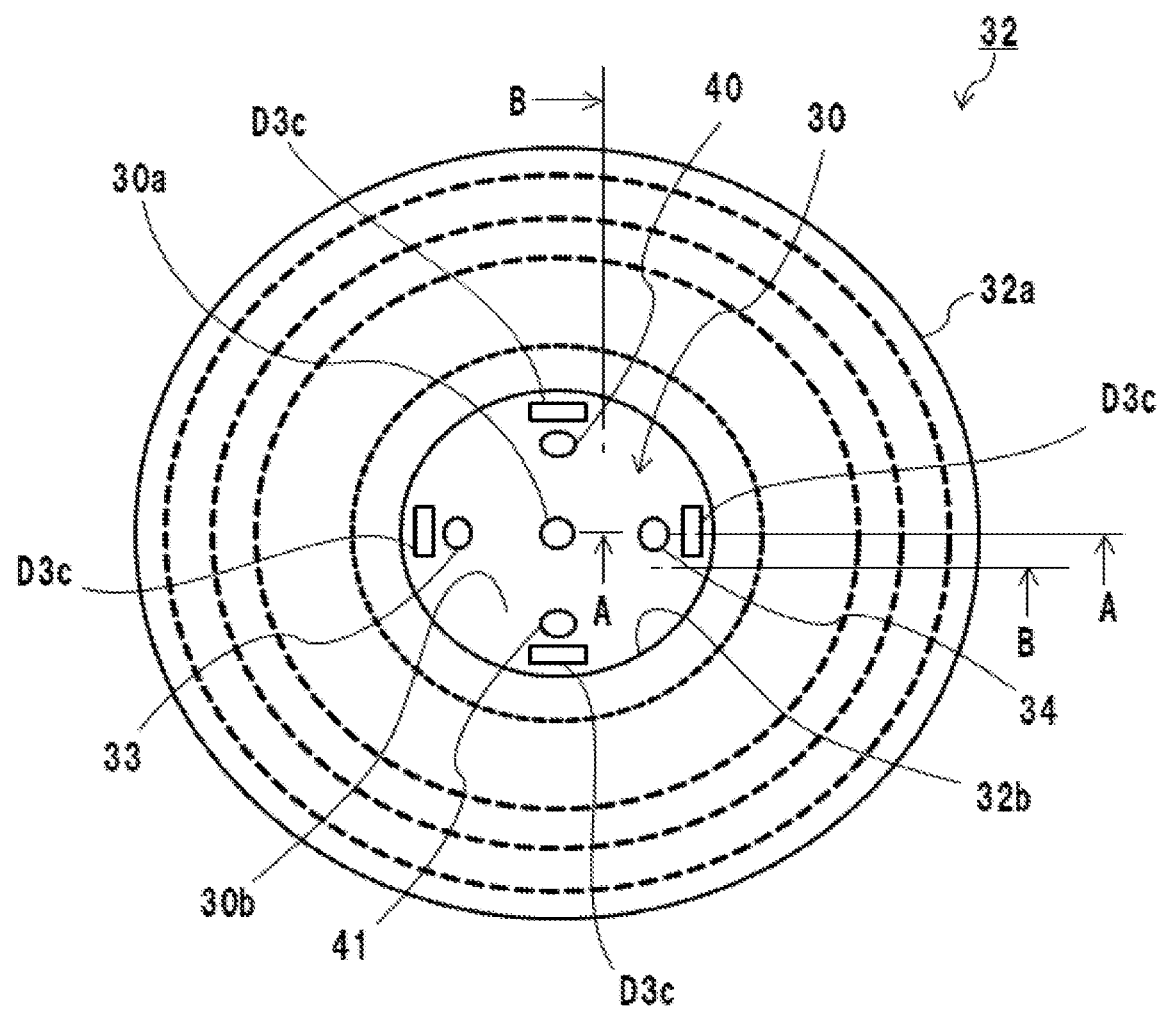
FIG. 14 is an enlarged plan view illustrating a configuration of a removing part of a seventh embodiment as viewed from a substrate side.

FIG. 14 is an enlarged plan view illustrating a configuration of removing parts D3c according to a seventh embodiment as viewed from the substrate W side. In this embodiment, differently from the above-described removing part D3a in which the removing material is discharged from the discharge port annularly provided on the inclined surface 30b of the recess 30, a plurality of discharge ports are provided along the periphery of the inclined surface 30b, and the removing material is discharged from each of the discharge ports.

As illustrated in the enlarged plan view of FIG. 14, there are provided four removing part D3c each having a discharge port. The four removing parts D3c are provided above the discharge nozzle of the treatment liquid. Further, the removing parts D3c are each located on a line connecting the center of the drain hole 30a and, for example, the center of the first chemical solution discharge nozzle 40 or the center of the second chemical solution discharge nozzle 41.

By providing the removing part D3c at such a position, for example, it is possible to reliably clean and remove liquid medicine discharged from the first chemical solution discharge nozzle 40 or the second chemical solution discharge nozzle 41 and remaining in the vicinity of the discharge nozzles.

Incidentally, if it is possible to remove all the droplets present on the inclined surface 30b, the number of discharge ports (removing parts D3c) to be provided can be arbitrarily set. In addition, the discharge angle at which the removing material is discharged from each of the discharge ports (the removing parts D3c) can also be arbitrarily set. For example, the angle may be set so that the removing material can be discharged at a wide angle. Further, a gas may be discharged from the removing part D3c instead of liquid such as pure water.

In this manner, the removing material is discharged from the discharge ports of the plurality of removing parts D3c. Thereby, the removing material flows along the inclined surface 30b toward the drain hole 30a. Thus, droplets present in the recess 30 can be drained and removed.

In addition, by continuously discharging the removing material from the removing part D3 or the removing part D3c from the etching step, it is possible to deprive the opportunity of liquid droplets to stay on the inclined surface 30b. By performing such control, it is possible to eliminate the presence of droplets per se on the inclined surface 30b. Thus, it is possible to easily perform the removal of liquid droplets.

Further, in order to continuously discharge the removing material from the removing parts (D3, D3c), preferably, the tip portions of the nozzles 33, 34, 40, and 41 provided in the recess 30 of the nozzle head 32 protrude from the inclined surface 30b of the recess 30. This is because it is possible to prevent the treatment liquid discharged from the removing parts (D3, D3c) and flowing on the inclined surface 30b from entering into the nozzles 33, 34, 40, and 41.

Figure 15:
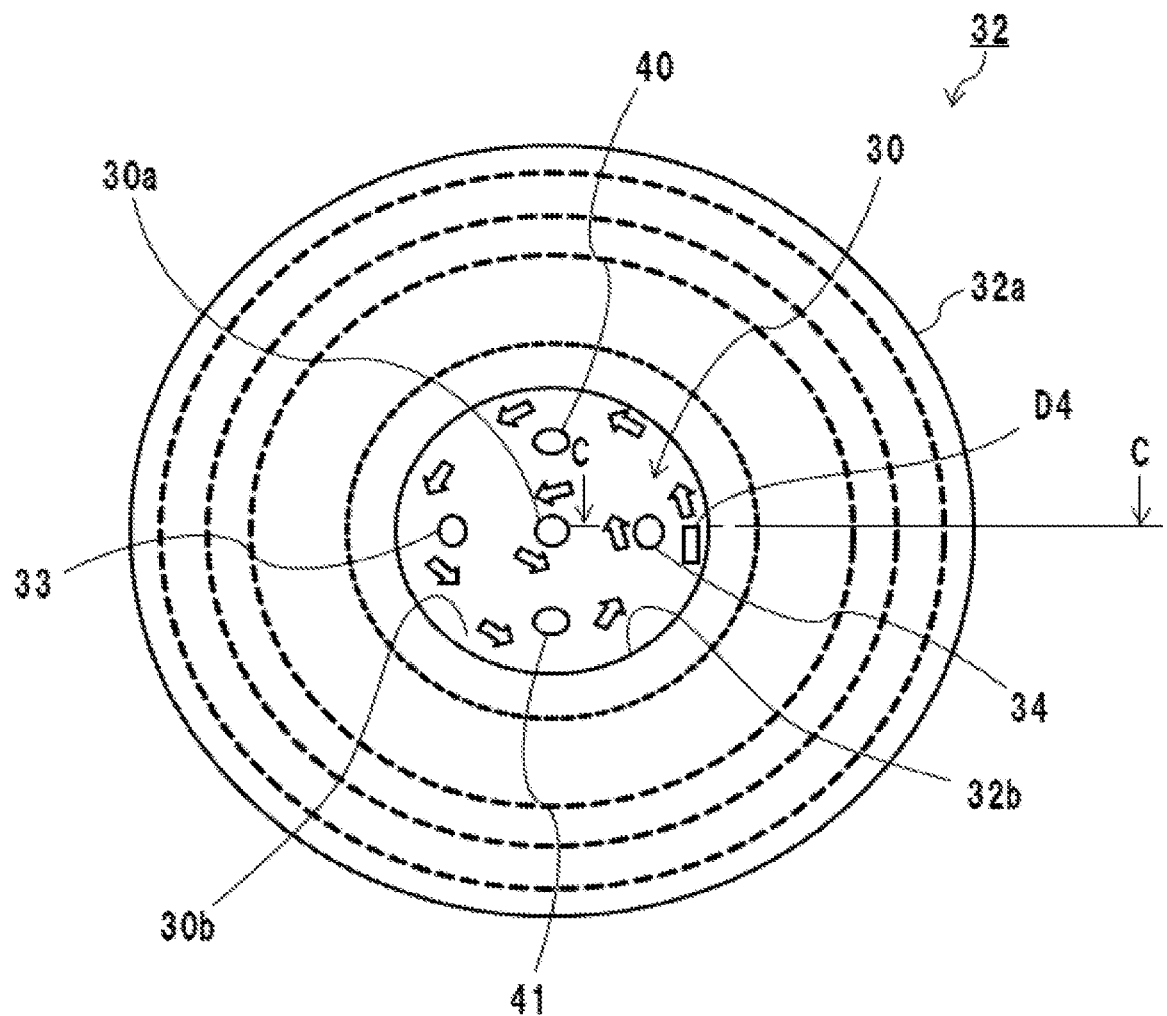
FIG. 15 is an enlarged plan view illustrating a configuration of a removing part of an eighth embodiment as viewed from a substrate side.
Figure 16:
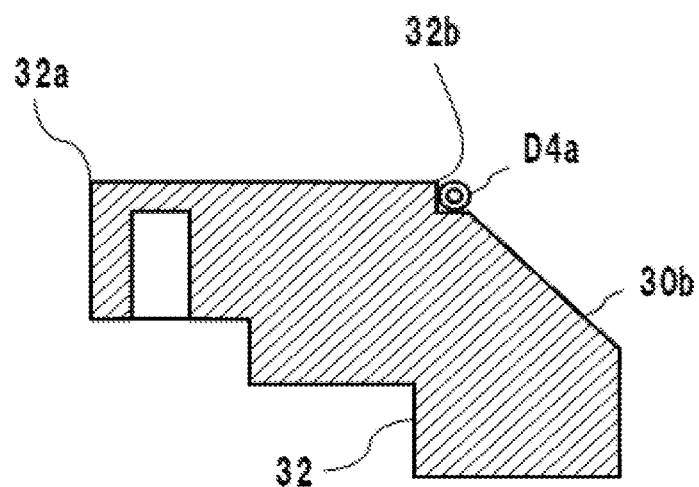
FIG. 16 is a schematic partially enlarged sectional view taken along a line C-C in FIG. 15.

FIG. 15 is an enlarged plan view illustrating a configuration of a removing part D4 according to an eighth embodiment as viewed from the substrate W side. FIG. 16 is a schematic partially enlarged sectional view taken along the line C-C in FIG. 15. The removing part D4 is formed of a nozzle D4a having a circular cross section. Besides, the removing part D4 is formed in an upper portion of the recess 30 close to the inner edge 32b of the nozzle head 32 such that its discharge port is substantially parallel to the inclined surface 30b. That is, the discharge port is arranged so as to face the circumferential direction of the inclined surface 30b.

Accordingly, when the removing material is discharged from the nozzle D4a, as indicated by the arrow in FIG. 15, the removing material flows in a spiral (whirl) on the inclined surface 30b, and reaches the drain hole 30a. Since the removing material flows in a spiral on the inclined surface 30b, the flow of the removing material covers the entire inclined surface 30b. Thus, it is possible to remove all of the liquid droplets present in the recess 30.

Figure 17:
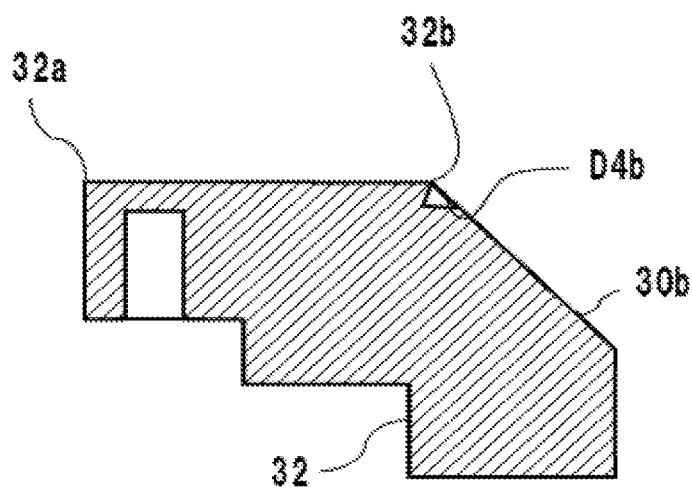
FIG. 17 is a schematic partially enlarged sectional view corresponding to FIG. 16 illustrating a removing part of a ninth embodiment.

FIG. 17 is a schematic partially enlarged sectional view illustrating a removing part D4 according to a ninth embodiment, and corresponds to FIG. 16. In the example of FIG. 17, the removing part D4 is configured as an opening D4b for discharging the removing material, and is formed directly on the inclined surface 30b. The opening D4b constituting the removing part D4 is arranged to face the circumferential direction of the inclined surface 30b such that, after being discharged, the removing material flows in parallel to the circumferential direction of the inclined surface 30b. The schematic sectional view of FIG. 17 illustrates the front surface of the discharge port of the opening D4b, and the shape of the discharge port is substantially triangular.

With such a configuration, it is possible to achieve the same effect as in the eighth embodiment.

Incidentally, in the eighth and ninth embodiments, the removing material discharged from the nozzle is caused to spirally flow on the inclined surface 30b by utilizing the discharge force thereof. Meanwhile, in the following embodiment, a guide groove D4c is provided such that the removing material discharged from the nozzle more reliably flows in a spiral on the inclined surface 30b.

Figure 18:
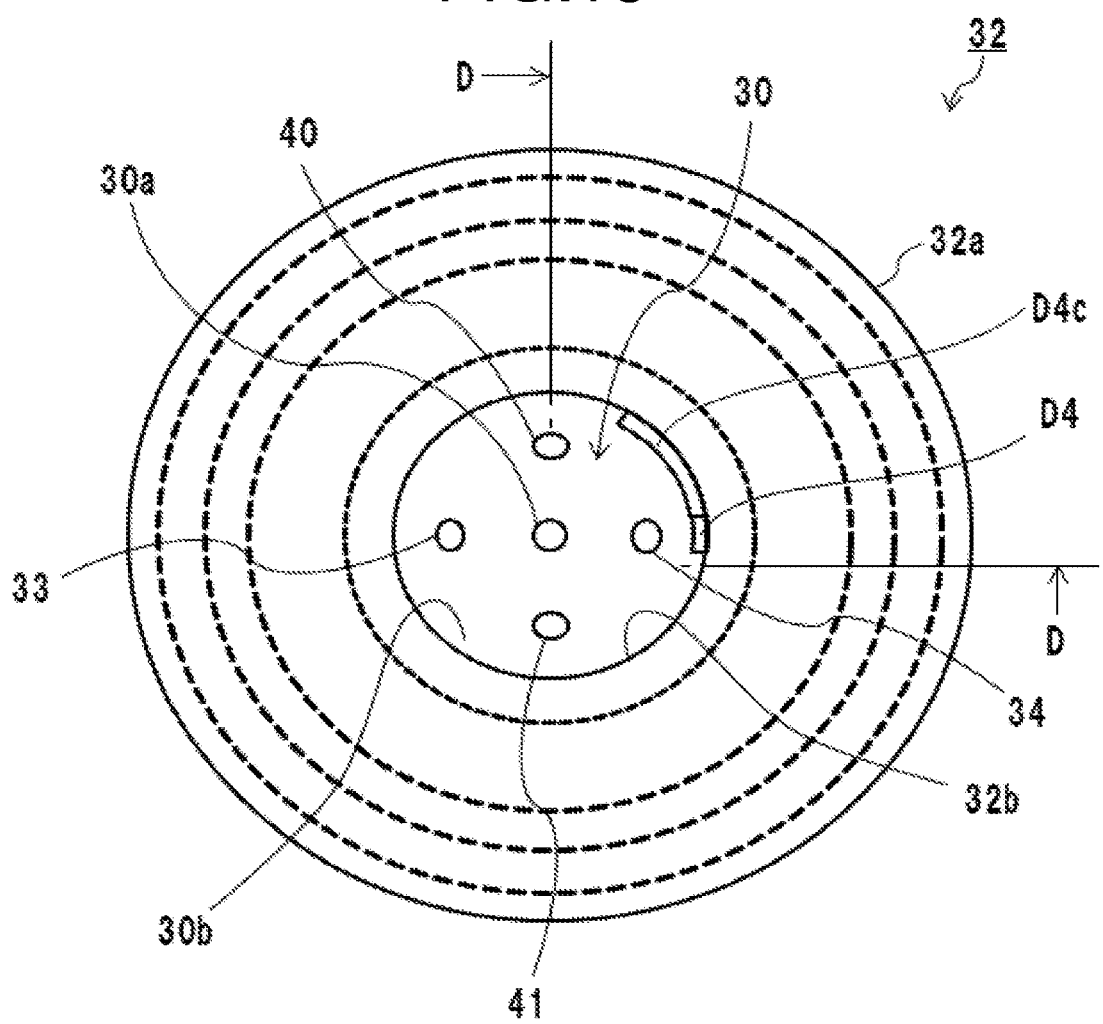
FIG. 18 is an enlarged plan view illustrating a configuration of a removing part of a tenth embodiment as viewed from a substrate side.
Figure 19:
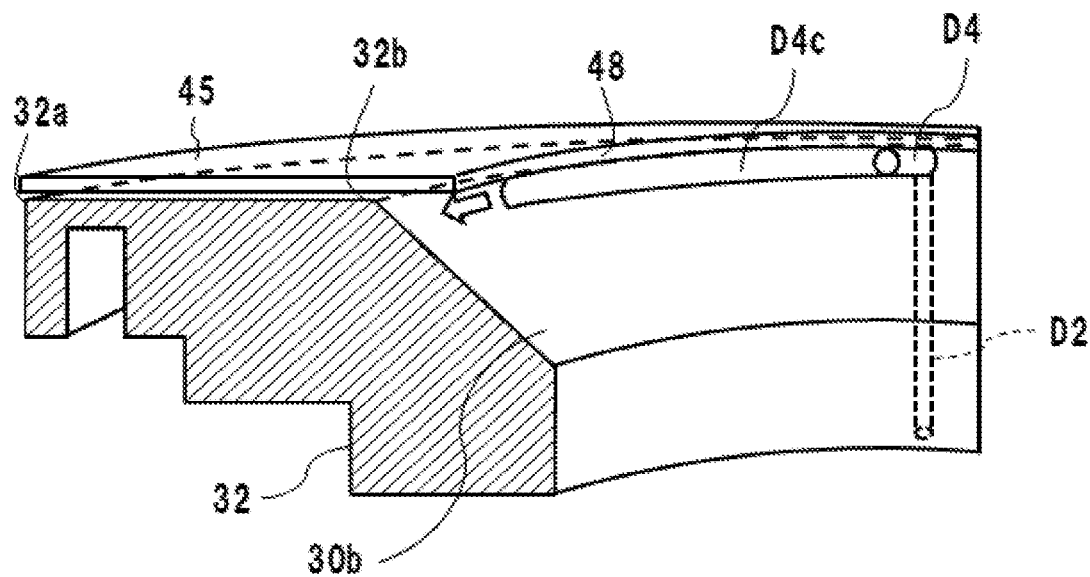
FIG. 19 is a schematic perspective view taken along the line D-D in FIG. 18.

FIG. 18 is an enlarged plan view illustrating a configuration of the removing part D4 according to a tenth embodiment as viewed from the substrate W side. FIG. 19 is a schematic perspective view taken along the line D-D in FIG. 18. In FIG. 19, the pure water discharge nozzle 34 and the first chemical solution discharge nozzle 40 are not illustrated.

This embodiment differs from the eighth embodiment described with reference to FIG. 15 in that a curved guide groove D4c is formed along the inclined surface 30b from the opening from which the removing material is discharged in the removing part D4. The guide groove D4c is formed over a certain distance from the opening from which the removing material is discharged. In FIG. 18, since the removing part D4 is located above the pure water discharge nozzle 34, the start point of the guide groove D4c is above the pure water discharge nozzle 34. The guide groove D4c is formed in a curved shape along the circumferential direction of the inclined surface 30b from the start point up to a position in front of and above the first chemical solution discharge nozzle 40.

Accordingly, the removing material such as pure water discharged from the removing part D4 is guided to the guide groove D4c immediately after being discharged and flows on the inclined surface 30b. After passing the end point of the guide groove D4c at the upper front of the first chemical solution discharge nozzle 40, the removing material flows down in a spiral on the inclined surface 30b, and flows toward the drain hole 30a while entraining droplets present on the inclined surface 30b. By the flow of the removing material, the liquid droplets present in the recess 30 can be drained and removed.

In the embodiment illustrated in FIG. 19, the guide groove D4c is formed with a constant groove width from the start point to the end point.

Figure 20:
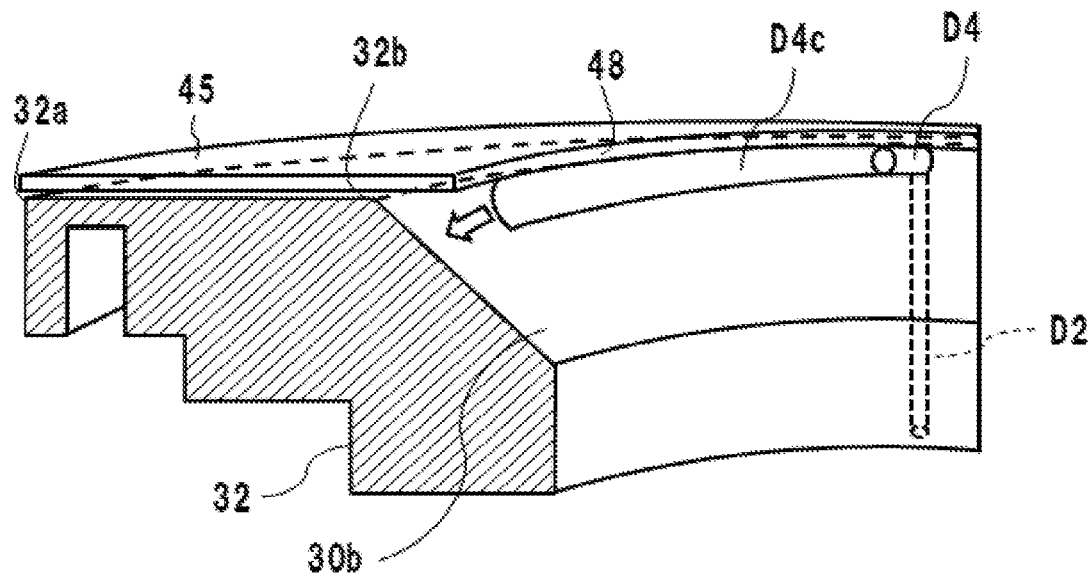
FIG. 20 is a schematic perspective view corresponding to FIG. 19 illustrating a configuration of a removing part of an eleventh embodiment.

FIG. 20 illustrates a configuration of the removing part D4 according to an eleventh embodiment, and corresponds to FIG. 19. In FIG. 20, the guide groove D4c is formed wider at the end point as compared to the start point. In other words, the width of the guide groove D4c gradually increases from the start point toward the end point. Thereby, the removing material such as pure water flowing through the guide groove D4c gradually flows on the inclined surface 30b toward the drain hole 30a toward. Thus, the discharged removing material can flow spirally in a more natural manner.

Incidentally, the length between the start point and the end point of the guide groove D4c, i.e., the position of the inclined surface 30b at which the end point is set, can be arbitrarily determined. It means that FIGS. 18 to 20 illustrate the length of the guide groove D4c by way of example only.

For example, the guide groove D4c may be formed to extend around the periphery of the inclined surface 30b such that the end of the guide groove D4c reaches a position, for example, behind or below the removing part D4. Further, the formation angle of the guide groove D4c, i.e., the angle from the start point to the end point can also be arbitrarily set.

Figure 21:
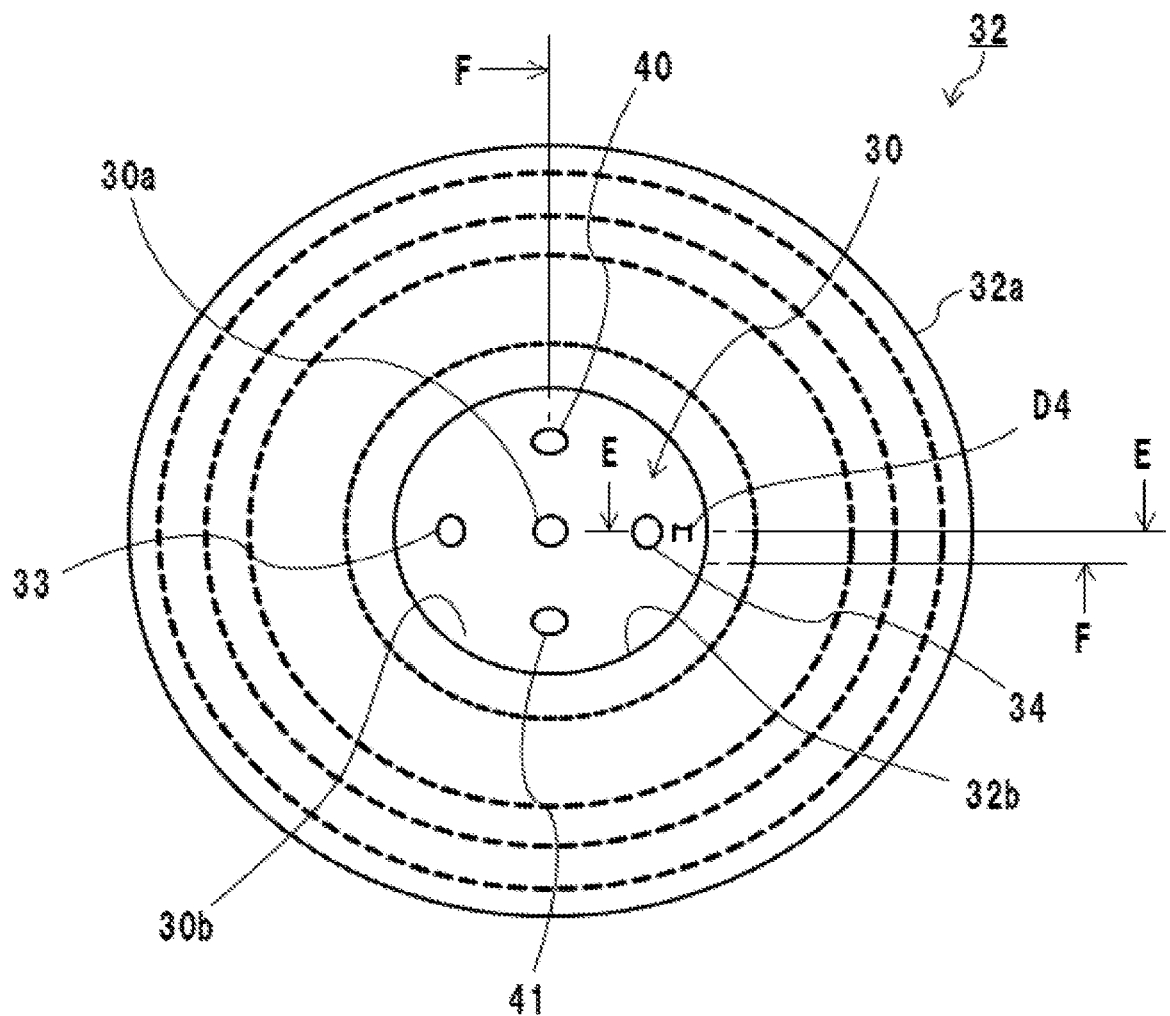
FIG. 21 is an enlarged plan view illustrating a configuration of a removing part of a twelfth embodiment as viewed from a substrate side.
Figure 22:
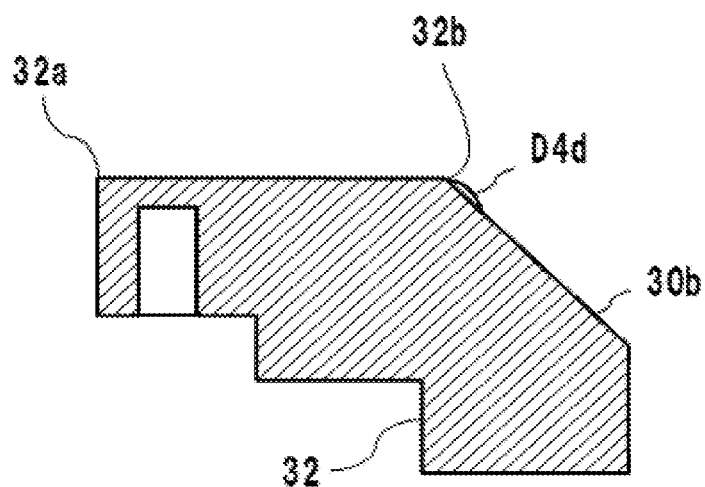
FIG. 22 is a schematic sectional view taken along the line E-E in FIG. 21.

FIG. 21 is an enlarged plan view illustrating a configuration of the removing part D4 according to a twelfth embodiment as viewed from the substrate W side. For example, the removing part D4 illustrated in FIGS. 16 and 17 is provided at a position which does not protrude on the surface of the inclined surface 30b. On the other hand, as illustrated in FIG. 22, the discharge port D4d constituting the removing part D4 is formed so as to protrude on the inclined surface 30b. However, if the discharge port D4d protrudes too much on the inclined surface 30b, droplets may stagnate in the discharge port D4d. Therefore, as illustrated in FIG. 22, the discharge port D4d is formed so as to make only a gentle bulge on the inclined surface 30b. With such a shape, even if it is formed on the inclined surface 30b, and, for example, even if splashing occurs on the inclined surface 30b, it is possible to avoid droplets from adhering to the discharge port D4d.

Figure 23:
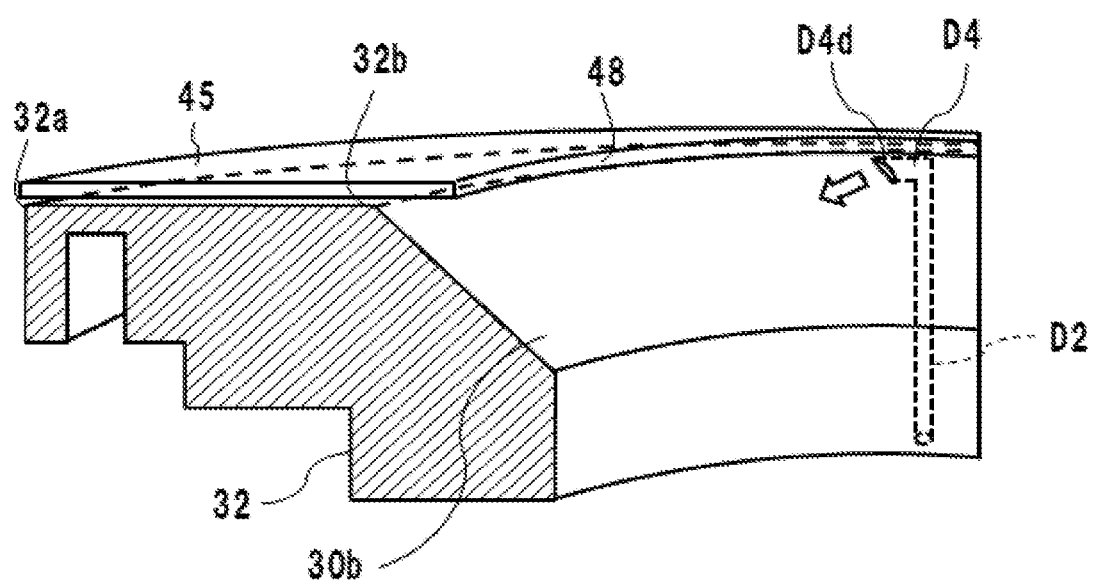
FIG. 23 is a schematic perspective view corresponding to a configuration of a removing part of a thirteenth embodiment taken along the line F-F in FIG. 21.

FIG. 23 is a schematic perspective view illustrating a configuration of the removing part D4 according to a thirteenth embodiment. Specifically, FIG. 23 is a schematic perspective view corresponding to the view taken along the line F-F in FIG. 21. The discharge port D4d is formed on the inclined surface 30b. Further, the discharge port D4d is formed such that its opening is not parallel to the inclined surface 30b but is oriented a little to the lower side of the inclined surface 30b.

Accordingly, as indicated by the arrow in FIG. 23, the removing material discharged from the discharge port D4d is discharged diagonally, i.e., toward the lower side of the inclined surface 30b immediately after having been discharged. By forming the discharge port D4d with such an angle as described above, the removing material can flow in a more spiral manner. Although not illustrated in FIG. 23, the aforementioned guide groove D4c may be formed in the discharge port D4d.

As described above, also in the twelfth and thirteenth embodiments, it is possible to achieve the same effect as in the eighth and ninth embodiments described above.

As described above, by employing a configuration that allows a removing material such as a gas or a liquid to flow in a spiral (whirl) along the inclined surface 30b, remove all of liquid droplets present in the recess 30 can be removed.

Incidentally, the configuration described with reference to FIGS. 15 to 23 may include the configuration of each part described. Any number of removing parts (D4) may be formed on the inclined surface 30b. For example, removing parts may be formed in four places on the inclined surface 30b with an interval of 90 degrees therebetween. Further, the removing parts may be combined with the guide groove D4c as appropriate, and the length and width of the guide groove D4c can be freely set. As indicated by the broken line in each of the perspective views, a removing material supply passage D3a is provided for supplying the removing material to the removing parts D3 and D4.

Figure 24:
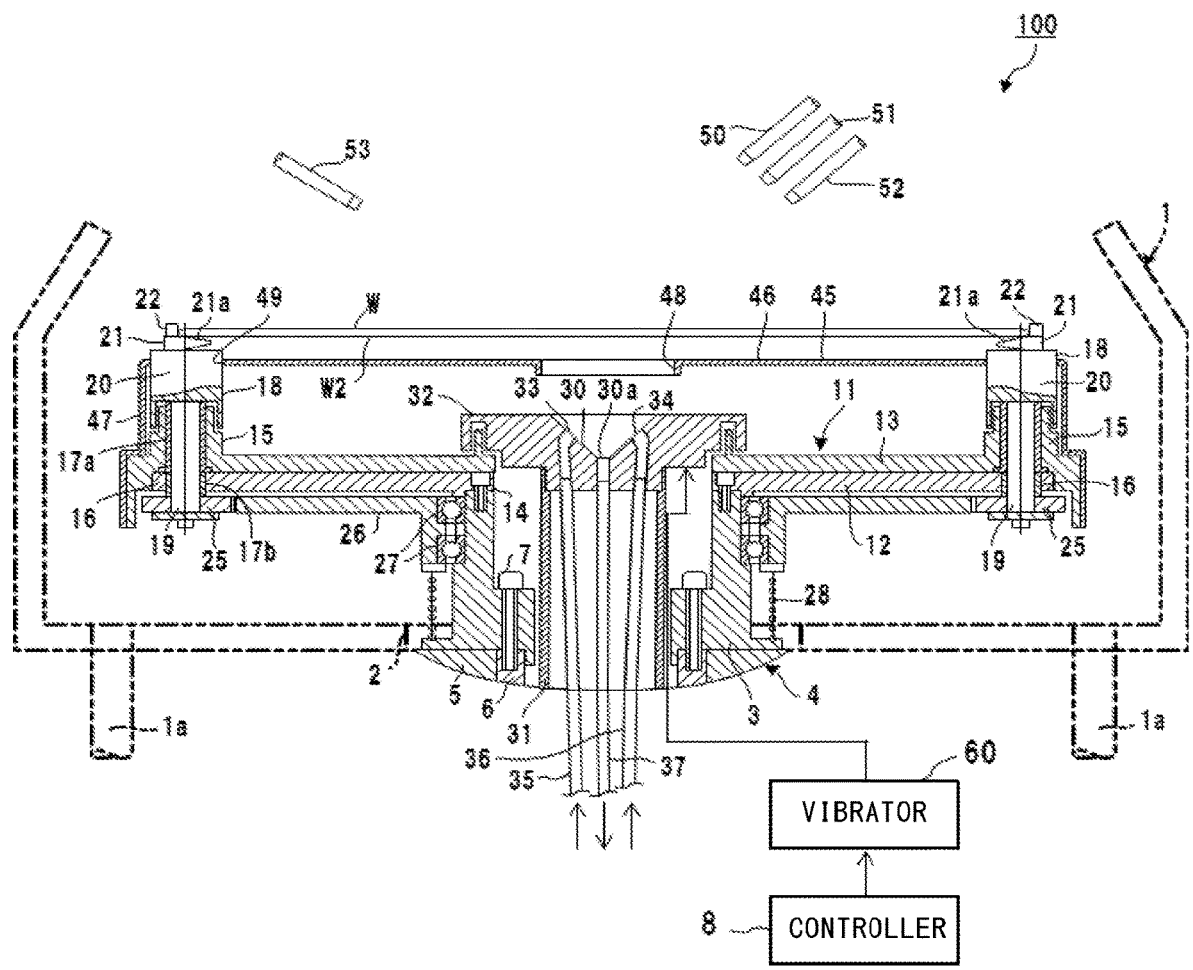
FIG. 24 is a cross-sectional view illustrating a schematic configuration of a substrate processing apparatus according to a fourteenth embodiment.

FIG. 24 is a cross-sectional view illustrating a schematic configuration of a substrate processing apparatus according to a fourteenth embodiment. A substrate processing apparatus 100A includes a vibrator 60. The vibrator 60 is connected to the nozzle head 32 and applies vibrations to the nozzle head 32 under the control of the controller 8.

As the vibrator 60, for example, an ultrasonic vibrator can be used.

In this way, by directly applying vibration to the nozzle head 32, liquid droplets present in the recess 30 flow along the inclined surface 30b. As a result, the liquid droplets gather in the drain hole 30a and are thereby removed.

As an example, the application of ultrasonic vibration to the nozzle head 32 is started in a period between the end of the rinsing step and the start of the drying step, and is continued also in the drying step. The application of ultrasonic vibration is stopped when the drying process is completed. The application of ultrasonic vibration to the nozzle head 32 may be started from the beginning of the etching step and continued until the end of the drying step. In short, it suffices that a vibration application period is present in a period between the end of the rinsing step and the start of the drying step.

Figure 25:
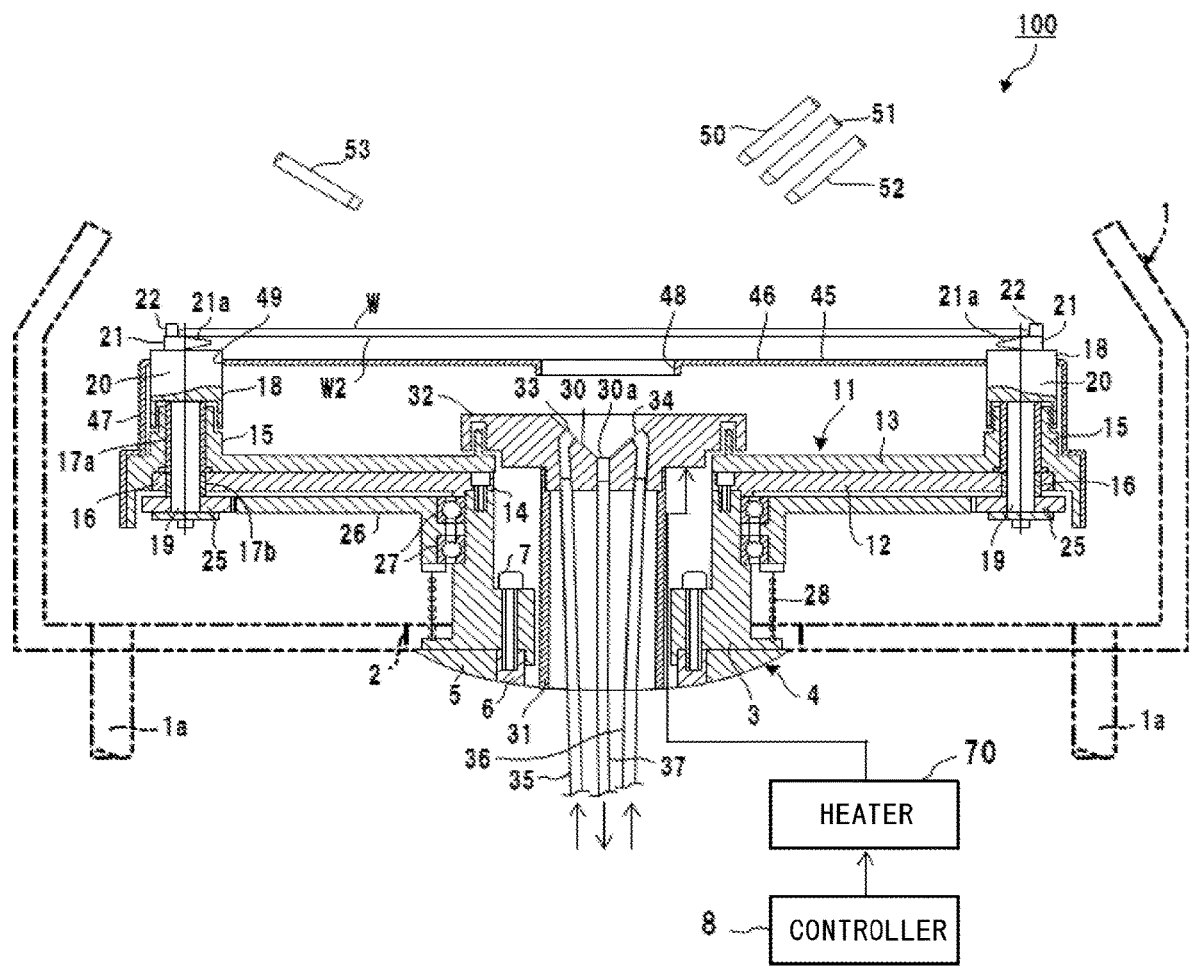
FIG. 25 is a cross-sectional view illustrating a schematic configuration of a substrate processing apparatus according to a fifteenth embodiment.

Next, FIG. 25 is a cross-sectional view illustrating a schematic configuration of a substrate processing apparatus 100B according to a fifteenth embodiment. The substrate processing apparatus 100B includes a heater 70. The heater 70 heats the entire nozzle head 32. By heating the nozzle head 32, droplets present in the recess 30 are evaporated and removed.

Preferably, the process of heating the nozzle head 32 using the heater 70 to evaporate liquid droplets present in the recess 30 is not performed while the substrate W is placed on the holding members 18. If the droplets present in the recess 30 evaporate and adhere to the back surface W2 and the like of the substrate W, water stains may be generated due to re-adhesion.

As to the heater, for example, the nozzle head (the recess 30) may be heated by irradiating it with light from above the recess 30 using a halogen lamp or the like. Specifically, after the processing of the substrate W in the substrate processing apparatus 100B is completed and the substrate W is taken out, the recess 30 is heated from an upper position (facing the recess 30), which is not blocked by the substrate W so that droplets evaporate.

As the heater, in addition to the heating of the nozzle head 32 by irradiating light from above the recess 30, anything such as, for example, an electric heater, may be used as long as it can heat the nozzle head to cause the evaporation of droplets. Further, the location of the heater 70 is also not limited.

Figure 26:
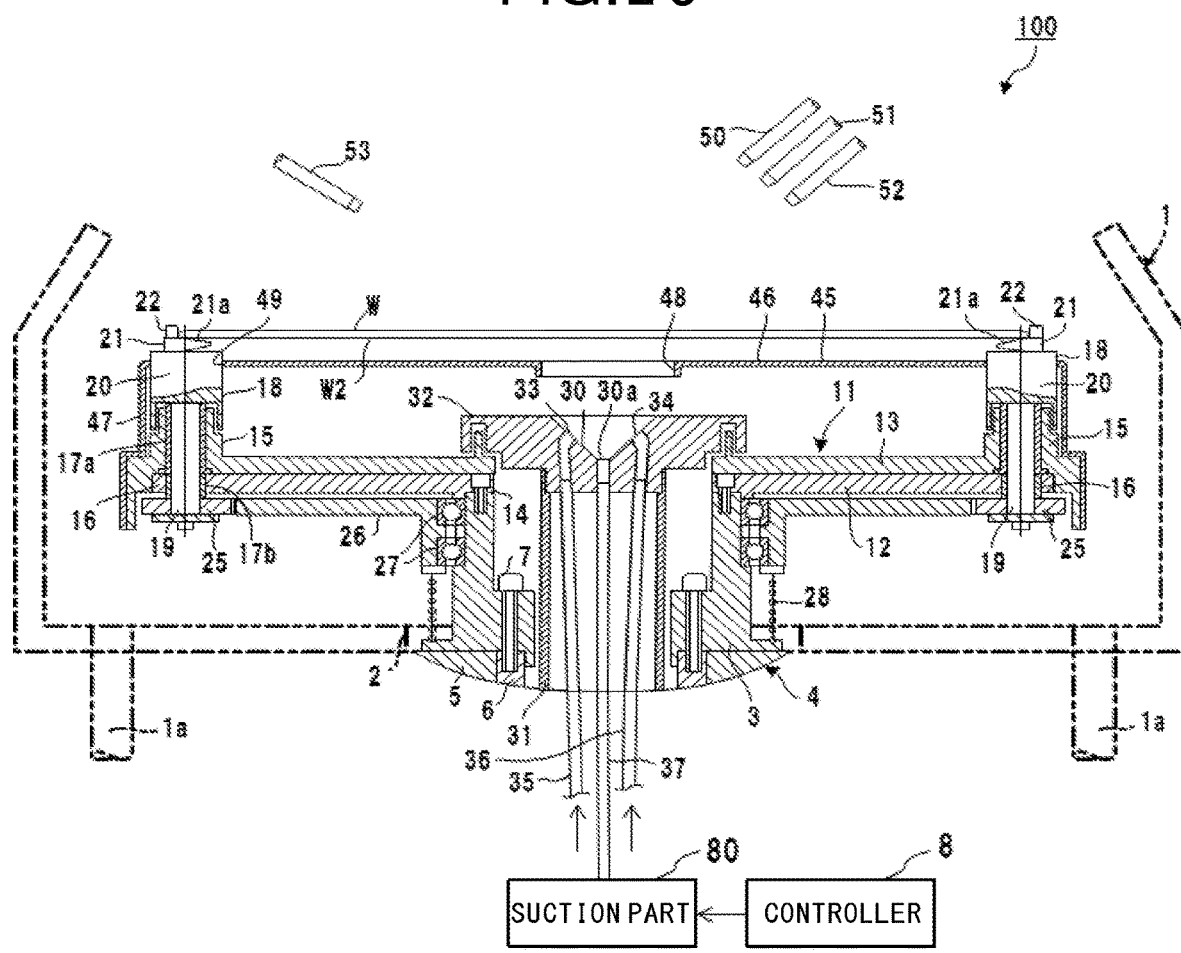
FIG. 26 is a cross-sectional view illustrating a schematic configuration of a substrate processing apparatus according to a sixteenth embodiment.

FIG. 26 is a cross-sectional view illustrating a schematic configuration of a substrate processing apparatus 100C according to a sixteenth embodiment. As illustrated in FIG. 26, the substrate processing apparatus 100C includes a suction part 80. The suction part 80 is connected to the drain hole 30*a* at the bottom of the recess 30, and sucks liquid droplets drained to the drain hole 30*a*.

The suction part 80 is a device configured to forcibly drain liquid droplets out of the recess 30, and is connected to the drain hole 30*a* via the drain pipe 37. The suction part 80 is also connected to the controller 8, and is driven based on a control signal from the controller 8. As to the driving of the suction part 80, for example, the flow rate may be controlled with a flow meter and an air operation valve by using a gas such as air or nitrogen.

According to this embodiment, by applying a suction force to the drain hole 30*a*, liquid droplets staying in the recess 30 and those to adhere thereto can be forcefully drained out of the recess 30. Thus, it is possible to prevent poor drying due to liquid droplets staying on the surface of the recess 30.

Figure 27:
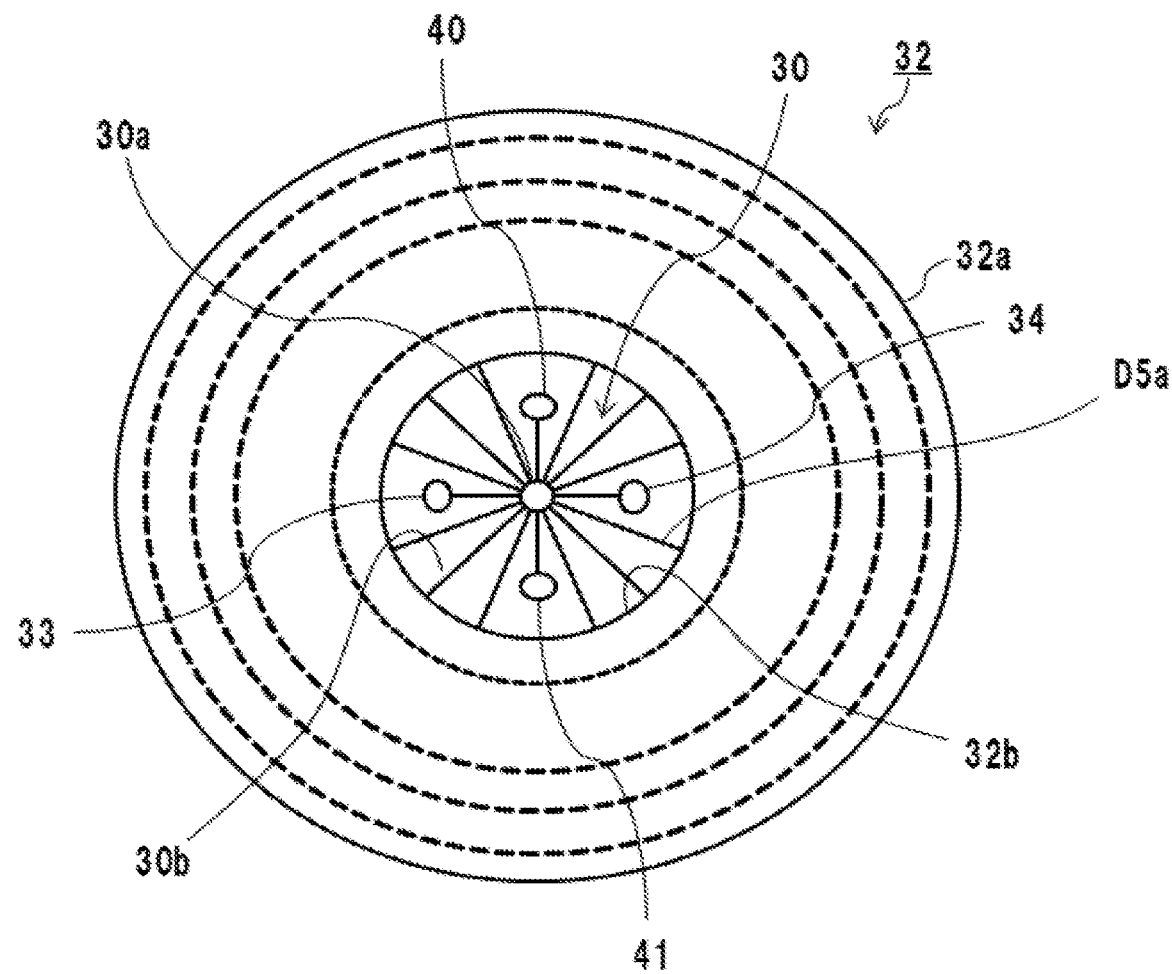
FIG. 27 is an enlarged plan view illustrating a configuration of a removing part of a seventeenth embodiment as viewed from a substrate side.

FIG. 27 is an enlarged plan view illustrating a configuration of the removing part D5 according to a seventeenth embodiment as viewed from the substrate W side. The basic configuration of the substrate processing apparatus 100 is the same as described above.

The configuration illustrated in FIG. 27 is characterized in that grooves D5*a* as a removing part are formed along the inclined surface 30*b* so as to connect the inner edge 32*b*, which is the upper end of the inclined surface 30*b*, and the drain hole 30*a* with the shortest distance. Because of the grooves D5*a* provided along the inclined surface 30*b*, liquid droplets, which are about to stay on the inclined surface 30*b*, are naturally guided to the drain hole 30*a* along the groove D5*a*.

In FIG. 27, sixteen grooves (D5*a*) are provided at regular intervals around the inner edge 32*b*. Note that if there are not enough grooves (D5*a*), it is difficult to appropriately lead the droplets about to stay on the inclined surface 30*b* to the drain hole 30*a*, whereas if there are too much grooves (D5*a*) and the width of them is too small, it seems that the droplets cannot flow properly. Therefore, the number of the grooves D5*a* to be provided in the inclined surface 30*b* is appropriately set in consideration of the size, depth, and the like of the grooves.

When the grooves D5*a* are formed to connect the inner edge 32*b*, which is the upper end of the inclined surface 30*b*, and the drain hole 30*a* with the shortest distance, the gas discharge nozzle 33, the pure water discharge nozzle 34, the first chemical solution discharge nozzle 40, and the second chemical solution discharge nozzle 41 may be present in the middle of some of the grooves D5*a*. With respect to such the grooves D5*a*, as illustrated in FIG. 27, preferably, the groove D5*a* is not formed in a region connecting the inner edge 32*b* and each of the nozzles such as the gas discharge nozzle 33. This is to prevent liquid droplets flowing through the grooves D5*a* from entering the nozzles such as the gas discharge nozzle 33.

Preferably, the grooves D5*a* are configured such that the boundary with the surface of the inclined surface 30*b* does not form a corner and draws a smooth continuous curved surface. If this portion is formed with corners, droplets adhere to the inclined surface 30*b* with a stronger adhesive force due to their surface tension. As a result, the droplets are less likely to enter into the groove D5*a*, and it becomes difficult to guide the droplets to the drain hole 30*a* through the grooves D5*a*. Further, it is preferable that each of the grooves D5*a* is also formed of a curved surface.

Figure 28:
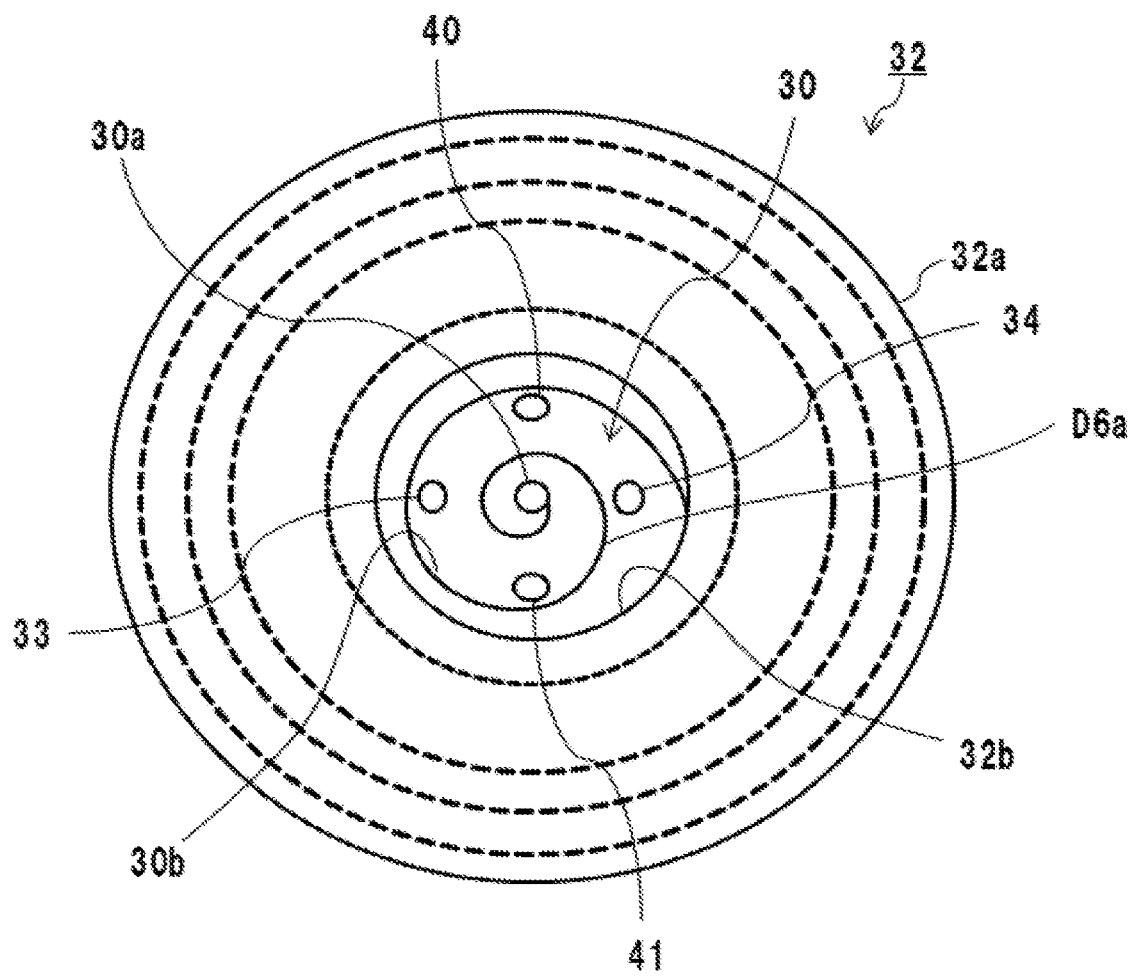
FIG. 28 is an enlarged plan view illustrating a configuration of a removing part of an eighteenth embodiment viewed from the substrate side.

FIG. 28 is an enlarged plan view illustrating a configuration of a removing part D6 according to an eighteenth embodiment as viewed from the substrate W side.

A groove D6*a* constituting the removing part D6 is formed in a spiral shape (spiral shape in the plan view of FIG. 28) on the inclined surface 30*b* from the inner edge 32*b*, which is the upper portion of the recess 30, toward the drain hole 30*a*. In addition, the groove D6*a* is formed so as to avoid each nozzle located on the inclined surface 30*b*. Incidentally, the size and depth of the groove D6*a* can be arbitrarily determined.

Further, with respect to the shape of the groove D6*a*, as with the grooves D5*a*, preferably, the boundary between the inclined surface 30*b* and the groove D6*a* as well as the groove D6*a* itself are formed with a curved surface. By providing the groove D6*a* in a spiral shape (spiral shape in the plan view of FIG. 28) on the surface of the inclined surface 30*b*, droplets, which are about to stay on the inclined surface 30*b*, drop in the groove D6*a* at a nearby point, and flow therein as being led to the drain hole 30*a*.

As illustrated in FIG. 28, the spiral of the groove D6*a* is formed counterclockwise from the inner edge 32*b* toward the drain hole 30*a*. This is the same direction as the rotation direction of the substrate W when various processes are performed on the substrate W placed above the nozzle head 32. By forming the groove D6*a* to have the spiral direction the same as the rotation direction of the substrate W, droplets present in the recess 30 can be moved by using an air current generated along with the counterclockwise rotation of the substrate W.

Next, as a nineteenth embodiment, a configuration can be employed in which the surface of the inclined surface 30*b* of the nozzle head 32 is formed to be rough. That is, the inclined surface 30*b* may be formed to have a desired surface roughness by setting the surface roughness Ra to a predetermined value.

For example, if droplets are collectively present on the inclined surface 30*b* due to the surface tension, when the gas discharge nozzle 33 discharges a gas, particularly when the nozzle head 32 is made of a hydrophobic material, a phenomenon occurs in which the droplets splash or bounce in the recess 30 due to the gas. Consequently, for example, the splashed droplets adhere to the back surface W2 of the substrate W, which may cause water stains due to re-adhesion.

Therefore, the surface of the inclined surface 30*b* is formed to be rough so that droplets present on the inclined surface 30*b* are least likely to gather due to the surface tension. Thereby, the droplets present on the inclined surface 30*b* do not gather by the surface tension, and can flow into the drain hole 30*a*.

The surface roughness Ra can be arbitrarily set according to the material of the nozzle head 32. For example, it is assumed that the nozzle head 32 is made of a hydrophilic material. In this case, if the hydrophilic surface is roughened, the contact angle of a droplet becomes smaller, and the hydrophilicity of the droplet with respect to the nozzle head 32 is increased. As the hydrophilicity increases, if the droplet adheres to the inclined surface 30*b*, it tends to stick to the inclined surface 30*b*. Therefore, the droplet can be prevented from scattering.

On the other hand, in the case where the nozzle head 32 is made of a hydrophobic material, if the surface of the inclined surface 30*b* is formed to be rough, the contact angle of the droplet with respect to the inclined surface 30*b* increases. As a result, the droplet can flow more easily on the inclined surface 30*b*. However, as described above, the liquid droplet is more likely to scatter. Therefore, it is required to set the surface roughness Ra in consideration of this point. Note that, for example, simultaneously with the chemical solution treatment on the back surface W2 of the substrate W, by injecting a gas toward the inclined surface 30b to such an extent that the liquid splashing does not occur, the droplet can flow smoothly toward the drain hole 30a while the scattering of the droplet is being suppressed.

As described above, a method of roughening the surface of the inclined surface 30b can be employed to prevent liquid droplets on the inclined surface 30b from scattering and adhering to the back surface W2 of the substrate due to the gathering of the droplets caused by the surface tension. In addition, the heater 70 described in the fifteenth embodiment can be used.

More specifically, the heater 70 may be used to heat the entire nozzle head 32 and increase the surface temperature of the inclined surface 30b, thereby preventing droplets from being gathered due to the surface tension. If the nozzle head 32 has been heated or is continuously heated with the heater 70, the temperature of the surface of the inclined surface 30b can be kept high so that the droplets evaporate. This prevents the droplets from scattering to the back surface W2 of the substrate W as well as preventing the gathering of the droplets so that the droplets can flow into the drain hole 30a. With such a configuration, droplets present in the recess 30 can be removed.

As a twentieth embodiment, a method can be employed in which the nozzle head 32 is made of a porous material, and liquid droplets present on the inclined surface 30b are taken into the inside of the inclined surface 30b, i.e., into the nozzle head 32. With this, even if it is not sufficient to only cause liquid droplets present in the recess 30 to flow to the drain hole 30a, the droplets are absorbed from the surface of the inclined surface 30b. As a result, it becomes possible to remove the droplets.

According to another embodiment, instead of forming the entire nozzle head 32 from a porous material, for example, a material having a porous property is applied to the inclined surface 30b such that liquid droplets present on the inclined surface 30b are taken into the applied material.

As described above, it is possible to provide a substrate processing apparatus capable of suppressing the occurrence of water stains due to re-adhesion by surely removing liquid droplets present in the recess of the nozzle head, or preventing the droplets from remaining in the recess.

In the embodiments, any of the embodiments described above may be appropriately selected and used in combination.

For example, droplets present in the recess may be removed by a combination of removal using gas and removal by flowing liquid. As a specific example, droplets present in the recess 30 are first rinsed off with a liquid removing material such as pure water. Then, a gas removing material is blown against the recess 30, whereby leading remaining liquid droplets and the removing material to the drain hole 30a. Besides, the suction part 80 may be combined with the configuration to suck liquid droplets out of the recess 30. Further, the grooves D5a or D6a may be provided on the inclined surface 30b such that no droplet remains on the inclined surface. Thereby, the droplets can be reliably removed.

In each of the above-described embodiments, in a period from the end of the rinsing step (process) to the start of the drying step (process), preferably, there is a period in which the removing material is being discharged from the removing part D, and in the sixteenth embodiment, there is a period in which suction force is applied to the drain hole 30a. For example, the timing for starting the discharge of the removing material and the timing for applying a suction force may be set in a period between the end of the rinsing step and the start of the drying step, or before the rinsing step is completed, for example, during the rinsing step or at the initial stage of the etching step. In addition, the timing for the end of discharge or suction may be before the start of the drying step. Alternatively, the discharge or suction may continue during the drying step, and during the drying step, or at the end of the drying step, or after the end of the drying step, the discharge or suction may be stopped.

In the first embodiment, in a period from the end of the rinsing step to the start of the drying step, the discharge of gas starts at the first flow rate (flow amount (flow rate) at which gas discharged from the gas discharge nozzle 33 does not reach the back surface W2 of the substrate W) from the hole D1a or the one end of the first nozzle D1, i.e., from the gas discharge nozzle 33. Thereby, treatment liquid, such as a chemical solution, which has entered both the nozzles, is removed before the drying step is started. This prevents such inconvenience that the chemical solution adheres to the substrate during the drying step.

However, the discharge may be started before the end of the rinsing step. For example, the discharge of the gas may be started during the rinsing step, or may be started from the initial stage of the etching step. In short, preferably there is a period in which the gas is discharged from the gas discharge nozzle 33 at the first flow rate in a period from the end of the rinsing step (process) to the start of the drying step (process). If the discharge of gas is started from the initial stage of the etching step, the chemical solution or the like can be prevented from entering into the gas discharge nozzle. Thereby, it is possible to shift to the drying step without waiting time after the rinse process is completed. Thus, it is possible to prevent such inconvenience that the chemical solution adheres to the substrate during the drying step.

When the removing material discharged from the removing part D is a liquid, the removing material may enter the gas discharging nozzle. In order to remove the removing material from the nozzle, preferably, the gas is discharged from the gas discharge nozzle 33 at the first flow rate while the removing material is being discharged from the removing part D or after the discharge is completed.

It should be noted that it is useful to jointly use these embodiments in other embodiments.

While a series of processes including the etching step, the chemical cleaning step, the rinsing step, and the drying step is described as an example of processing performed on the substrate, the embodiments of the present invention may be applicable to any processing that includes a treatment with the use of a treatment liquid.

While certain embodiments have been described, these embodiments have been presented by way of example only, and are not intended to limit the scope of the inventions. For example, while the supply of first treatment solution and that of second treatment solution are described as not overlapping in time, they may be partly overlapped. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

INDUSTRIAL APPLICABILITY

The present invention is used in a substrate processing apparatus.

EXPLANATION OF SYMBOLS

100 Substrate processing apparatus
30 Recess
30a Drain hole
30b Inclined surface
32 Nozzle head
33 Gas discharge nozzle
34 Pure water discharge nozzle
D1 Removing part (first nozzle)
D1a Hole

The invention claimed is:

1. A substrate processing apparatus comprising a nozzle head that faces a surface to be processed of a substrate and has a recess with its opening toward the surface to be processed, a treatment liquid supply nozzle provided to the nozzle head and configured to supply a treatment liquid to the surface to be processed, and a gas discharge nozzle configured to discharge a gas to the surface to be processed, the apparatus configured to perform a process using the treatment liquid and a drying process using the gas, the apparatus comprising:
  a removing part configured to remove liquid droplets present in the recess;
  a drain part located at a bottom of the recess of the nozzle head, and configured to discharge the liquid droplets as a target to be removed out of the recess;
  a controller configured to control discharge state of the gas discharge nozzle such that there is a period in which a gas is discharged from the gas discharge nozzle at a flow rate, at which the gas discharged does not reach the surface to be processed of the substrate, in a period from end of rinsing process using the treatment liquid to start of the drying process using the gas; and
  a cover that is located between the nozzle head and the substrate, and has an opening through which the treatment liquid, which is discharged from the treatment liquid supply nozzle provided to the nozzle head to perform treatment on the surface to be processed, passes, wherein
  the removing part includes a nozzle that is formed in the nozzle head and has a discharge port of a gas toward the cover, and a turner formed at the opening of the cover, and
  the nozzle is configured to discharge the gas toward the turner to lead the gas discharged to the recess.

2. The substrate processing apparatus according to claim 1, wherein the removing part further includes a suction part that is connected to the drain part, and sucks the liquid droplets present in the recess.

3. A substrate processing apparatus comprising a nozzle head that faces a surface to be processed of a substrate and has a recess with its opening toward the surface to be processed, a treatment liquid supply nozzle provided to the nozzle head and configured to supply a treatment liquid to the surface to be processed, and a gas discharge nozzle configured to discharge a gas to the surface to be processed, the apparatus configured to perform a process using the treatment liquid and a drying process using the gas, the apparatus comprising:
  a removing part configured to remove liquid droplets present in the recess;
  a drain part located at a bottom of the recess of the nozzle head, and configured to discharge the liquid droplets as a target to be removed out of the recess; and
  a controller configured to control discharge state of the gas discharge nozzle such that there is a period in which a gas is discharged from the gas discharge nozzle at a flow rate, at which the gas discharged does not reach the surface to be processed of the substrate, in a period from end of rinsing process using the treatment liquid to start of the drying process using the gas,
  wherein the removing part includes a discharge port that is located in a surface of the recess, and configured to discharge a removing material toward the drain part located at the bottom to remove the liquid droplets present in the recess.

4. The substrate processing apparatus according to claim 3, wherein the discharge port is formed annularly in the surface of the recess.

5. The substrate processing apparatus according to claim 3, wherein the discharge port is located in an upper portion of the recess, and is arranged in an orientation which is perpendicular to a line that connects location of the discharge port and the drain part with a shortest distance, and in which the removing material can be discharged along the surface of the recess.

6. The substrate processing apparatus according to claim 3, wherein the removing part further includes a vibrator that vibrates the nozzle head.

7. The substrate processing apparatus according to claim 3, wherein the removing part further includes a heater that heats the nozzle head.

8. The substrate processing apparatus according to claim 3, wherein a surface of the recess of the nozzle head is roughened to avoid retention of the liquid droplets as a target to be removed.

9. The substrate processing apparatus according to claim 3, wherein a porous material is applied to a surface of the recess of the nozzle head.

10. The substrate processing apparatus according to claim 3, wherein the recess of the nozzle head is formed of a porous material.

11. A substrate processing apparatus comprising a nozzle head that faces a surface to be processed of a substrate and has a recess with its opening toward the surface to be processed, a treatment liquid supply nozzle provided to the nozzle head and configured to supply a treatment liquid to the surface to be processed, and a gas discharge nozzle configured to discharge a gas to the surface to be processed, the apparatus configured to perform a process using the treatment liquid and a drying process using the gas, the apparatus comprising:
  a removing part configured to remove liquid droplets present in the recess;
  a drain part located at a bottom of the recess of the nozzle head, and configured to discharge the liquid droplets as a target to be removed out of the recess; and
  a controller configured to control discharge state of the gas discharge nozzle such that there is a period in which a gas is discharged from the gas discharge nozzle at a flow rate, at which the gas discharged does not reach the surface to be processed of the substrate, in a period from end of rinsing process using the treatment liquid to start of the drying process using the gas,
  wherein the removing part is a groove that is formed to connect an upper portion of the recess and the drain part located at the bottom of the recess with a shortest distance.

* * * * *